(12) United States Patent
Hotta

(10) Patent No.: US 7,619,288 B2
(45) Date of Patent: Nov. 17, 2009

(54) THIN FILM TRANSISTOR SUBSTRATE, LIQUID CRYSTAL DISPLAY DEVICE PROVIDED WITH SUCH THIN FILM TRANSISTOR SUBSTRATE AND METHOD FOR MANUFACTURING THIN FILM TRANSISTOR SUBSTRATE

(75) Inventor: Kazushige Hotta, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 49 days.

(21) Appl. No.: 11/886,147

(22) PCT Filed: May 16, 2006

(86) PCT No.: PCT/JP2006/309734

§ 371 (c)(1),
(2), (4) Date: Sep. 12, 2007

(87) PCT Pub. No.: WO2006/126423

PCT Pub. Date: Nov. 30, 2006

(65) Prior Publication Data
US 2008/0191214 A1 Aug. 14, 2008

(30) Foreign Application Priority Data
May 27, 2005 (JP) .............................. 2005-155058

(51) Int. Cl.
*H01L 27/088* (2006.01)
(52) U.S. Cl. .................. 257/402; 257/342; 257/344; 257/403; 257/E29.278
(58) Field of Classification Search .................. 257/75, 257/336, 338, 342, 344, 402, 403, E29.278
See application file for complete search history.

(56) References Cited

U.S. PATENT DOCUMENTS 6,104,449 A   8/2000   Takahashi et al.
6,153,453 A * 11/2000   Jimenez ...................... 438/200

(Continued)

FOREIGN PATENT DOCUMENTS

JP    11-068110    3/1999

(Continued)

OTHER PUBLICATIONS

International Search Report mailed Aug. 15, 2006.

*Primary Examiner*—Davienne Monbleau
*Assistant Examiner*—Eduardo A Rodela
(74) *Attorney, Agent, or Firm*—Nixon & Vanderhye P.C.

(57) ABSTRACT

A method for manufacturing a thin film transistor substrate includes a step of forming a plurality of island-like semiconductor films above an insulating transparent substrate; a step of forming a gate insulating film on each of the island-like semiconductor films; a step of forming first conductivity type LDD regions on both sides in the first island-like semiconductor film by leaving a channel region and forming a first conductivity type normally-on channel region having an impurity density equivalent to that of the LDD region in the second island-like semiconductor film; a step of forming a first gate electrode partially covering the LDD region and forming a second gate electrode above the normally-on channel region, and a step of forming a first conductivity type source/drain region having an impurity density higher than that of the LDD region in regions on the both sides of the gate electrode.

12 Claims, 15 Drawing Sheets

U.S. PATENT DOCUMENTS

| | | |
|---|---|---|
| 6,621,125 B1 * | 9/2003 | Wang .................. 257/355 |
| 6,777,716 B1 | 8/2004 | Yamazaki et al. |
| 2004/0191972 A1 | 9/2004 | Hotta |
| 2004/0206956 A1 * | 10/2004 | Yanai et al. ............. 257/59 |
| 2005/0007494 A1 | 1/2005 | Yamazaki et al. |
| 2006/0006425 A1 | 1/2006 | Hotta |
| 2006/0081852 A1 | 4/2006 | Hotta |

FOREIGN PATENT DOCUMENTS

| | | |
|---|---|---|
| JP | 11-202289 | 7/1999 |
| JP | 2000-010116 | 1/2000 |
| JP | 2005-116838 | 4/2005 |

* cited by examiner

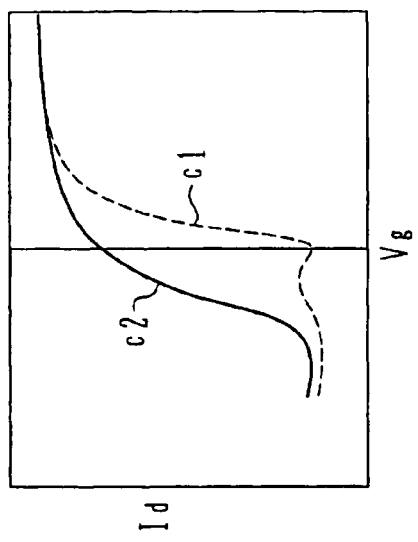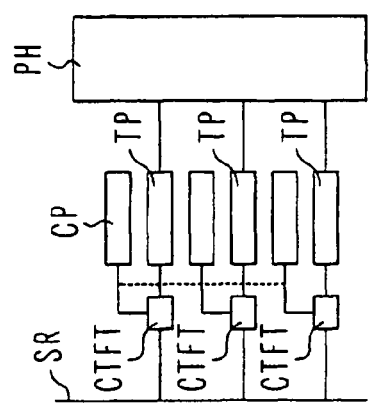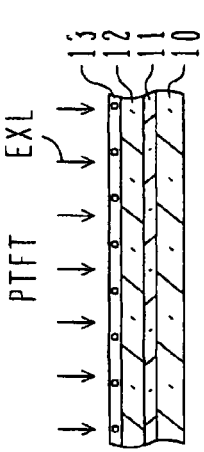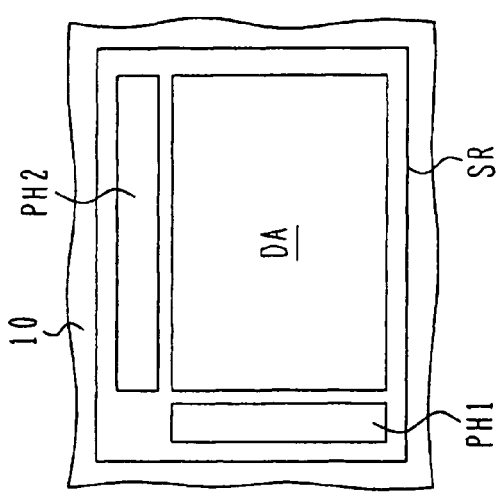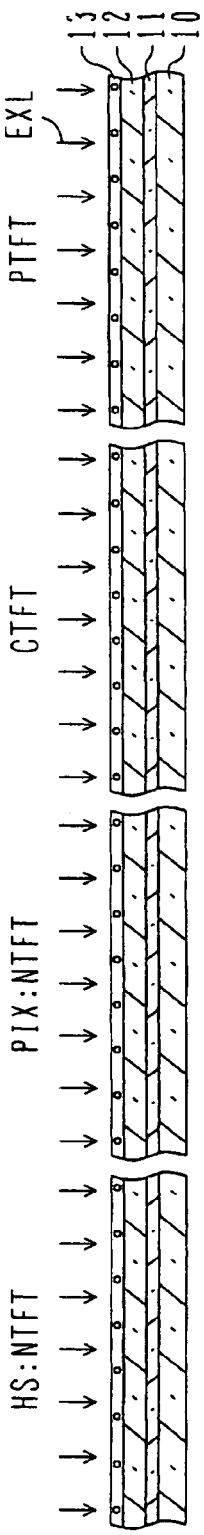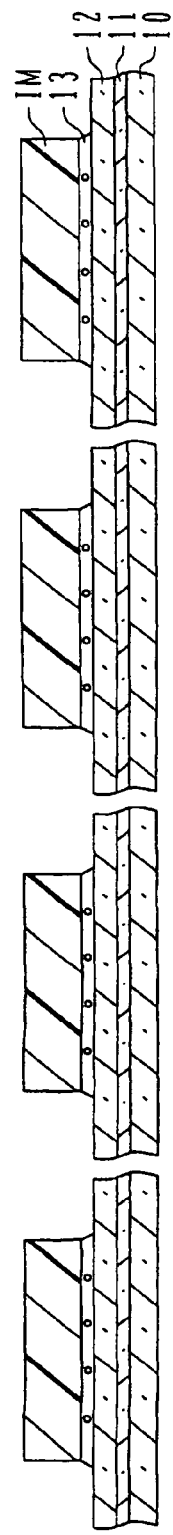

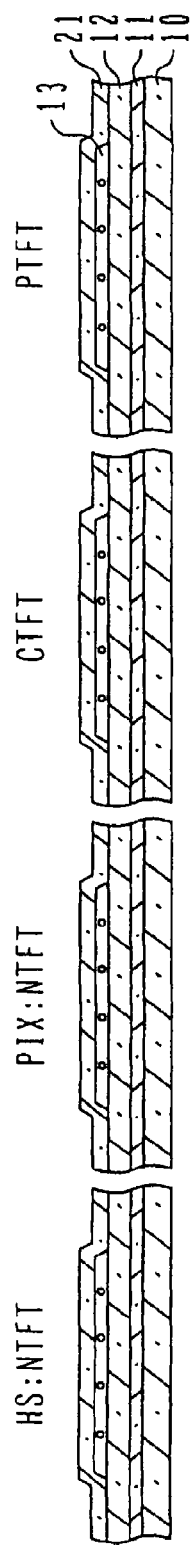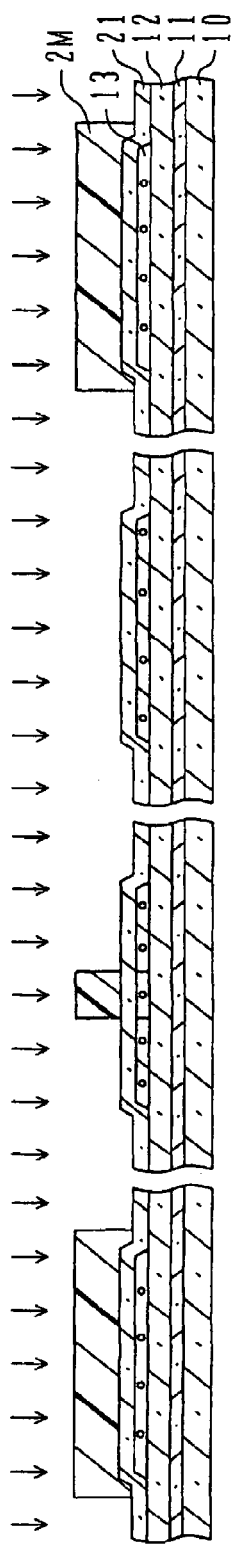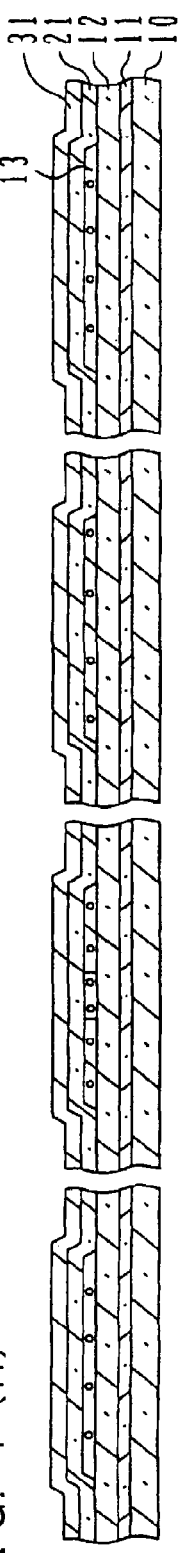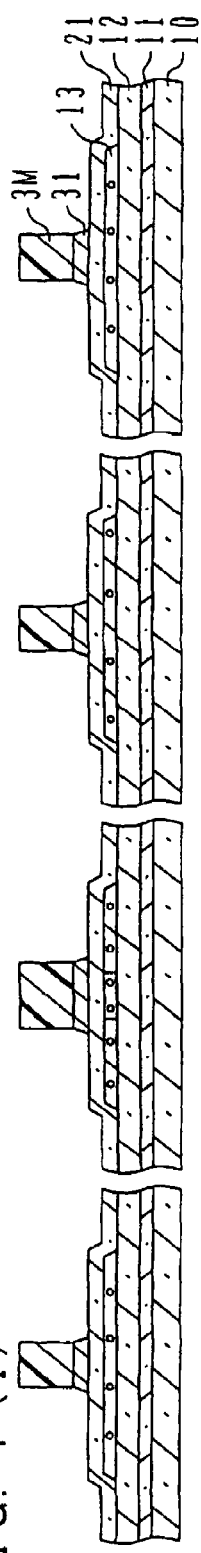

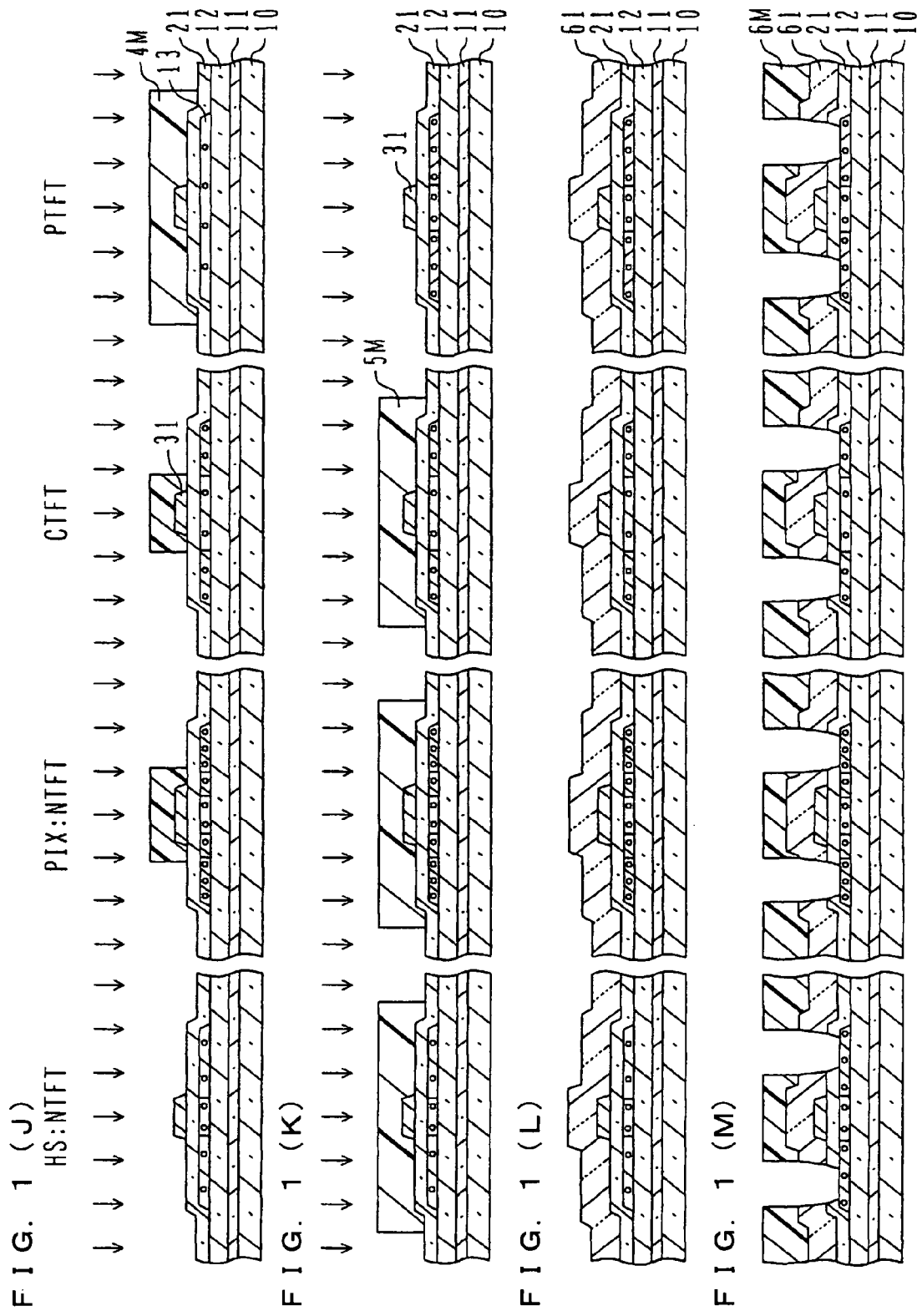

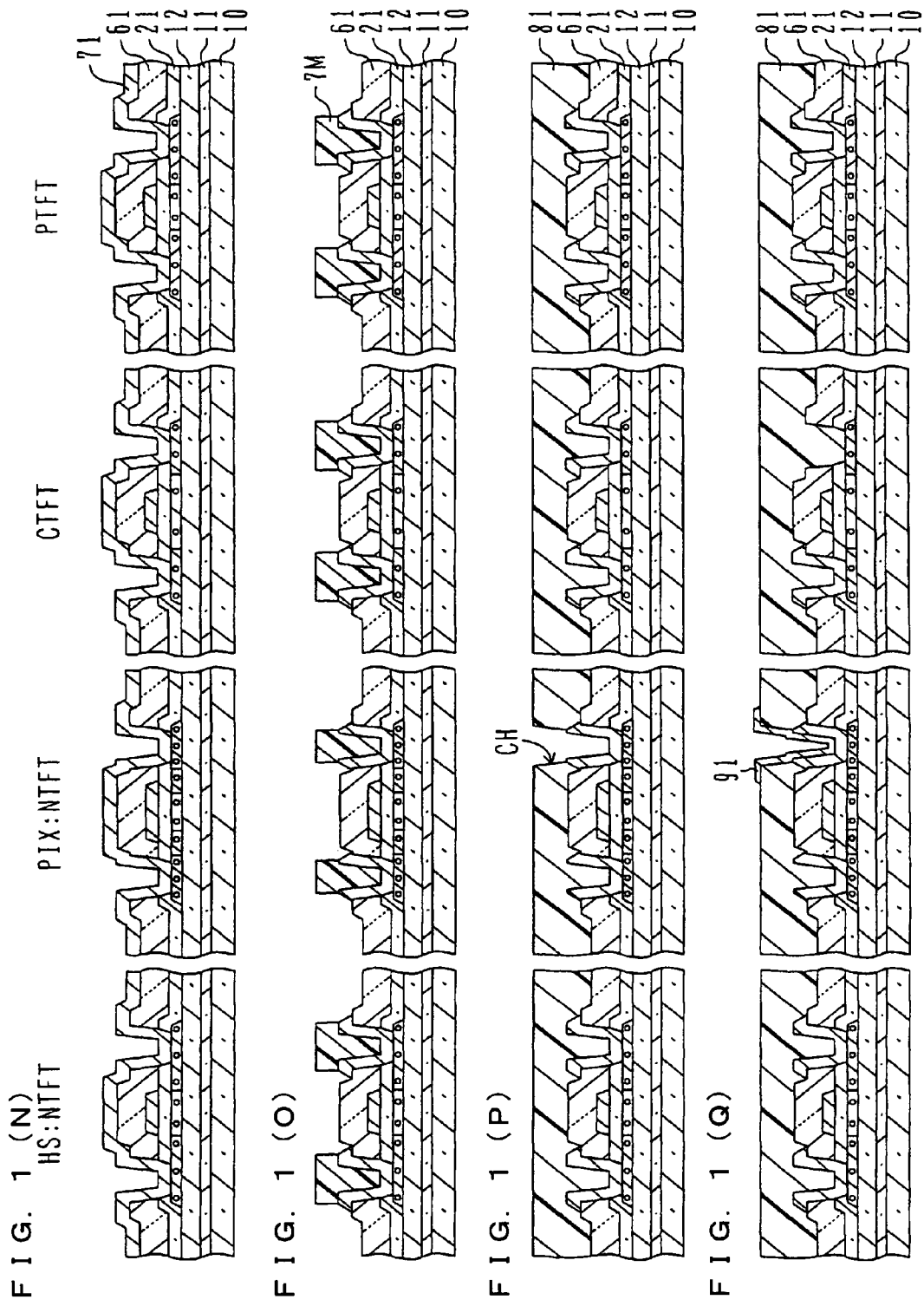

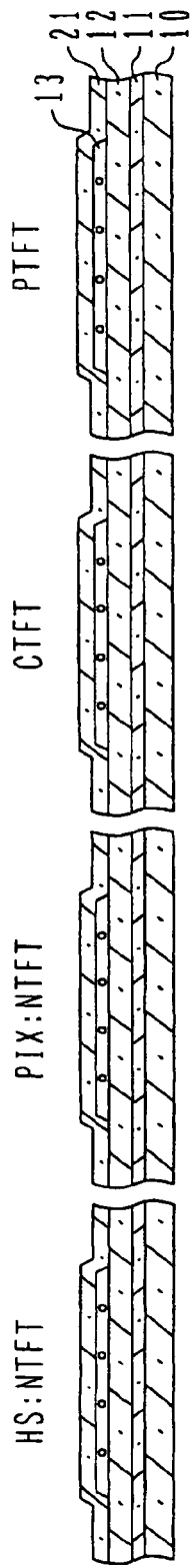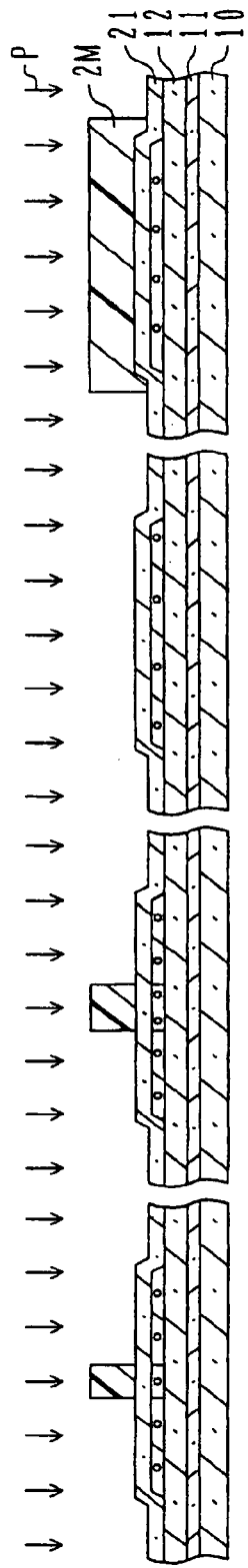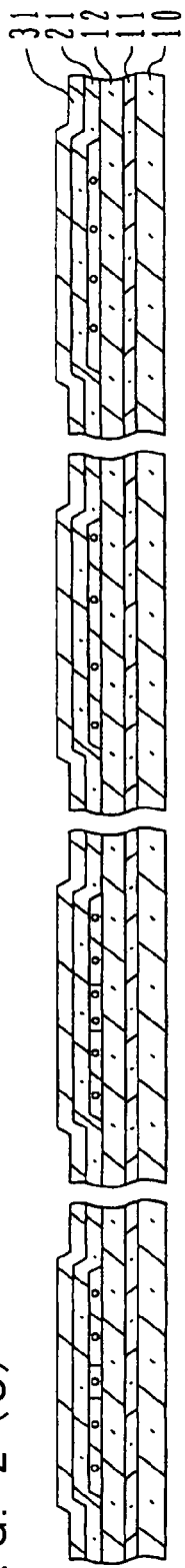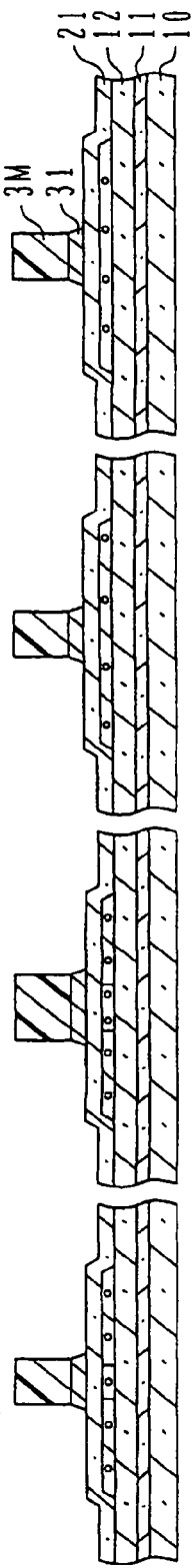

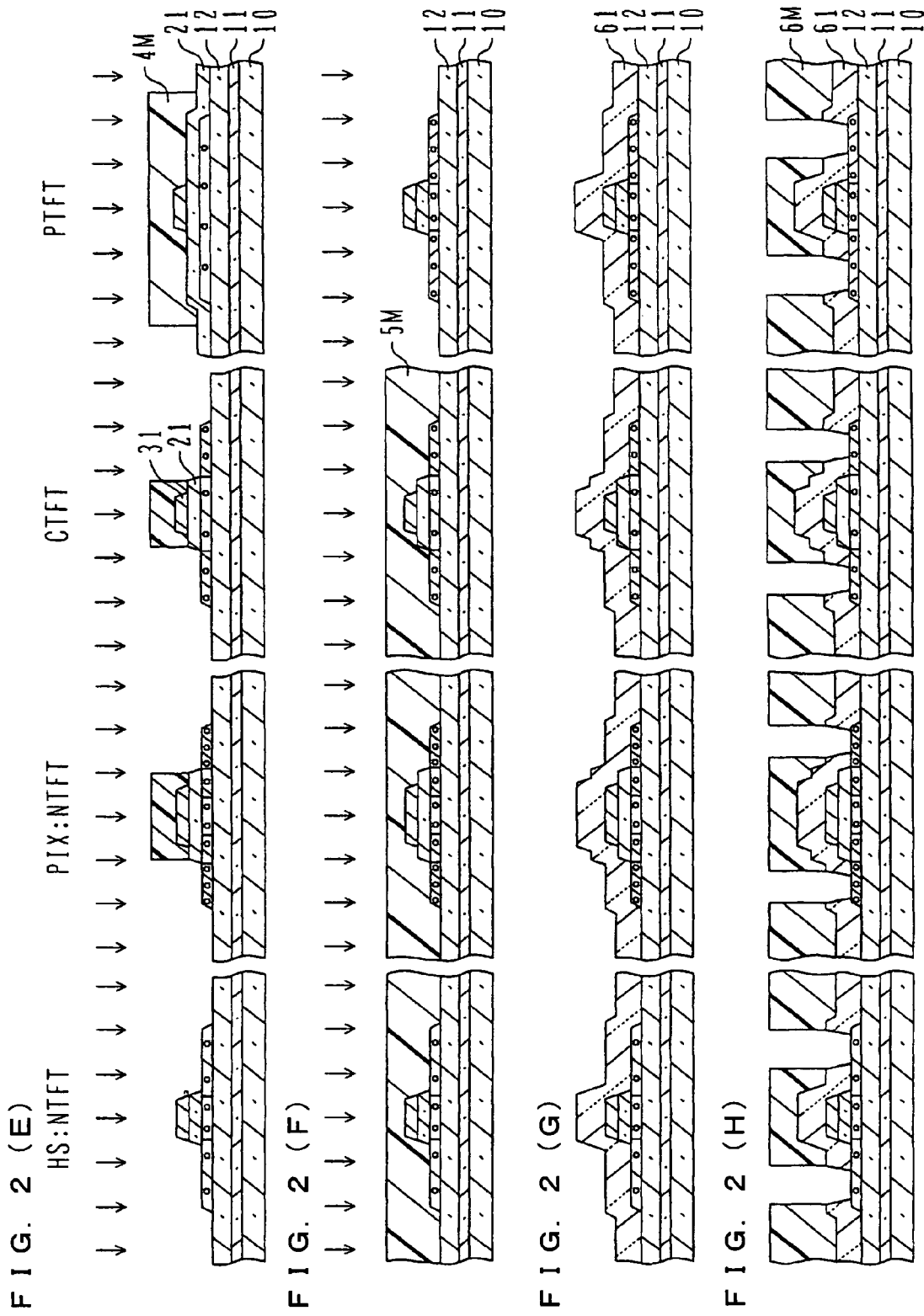

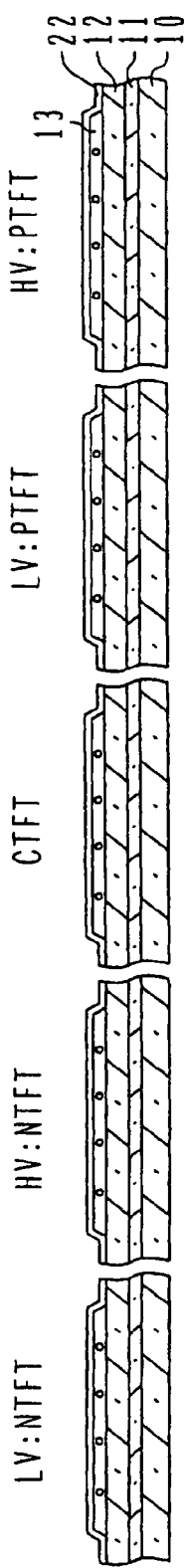
F I G. 3 (A)
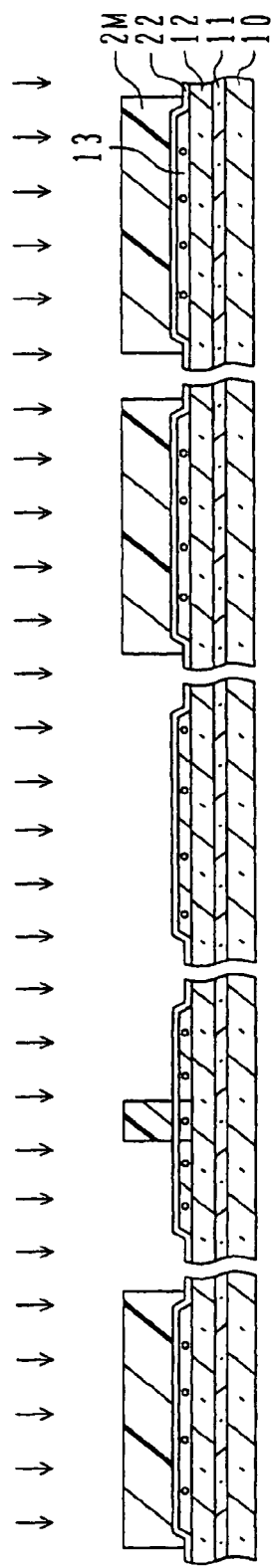
F I G. 3 (B)
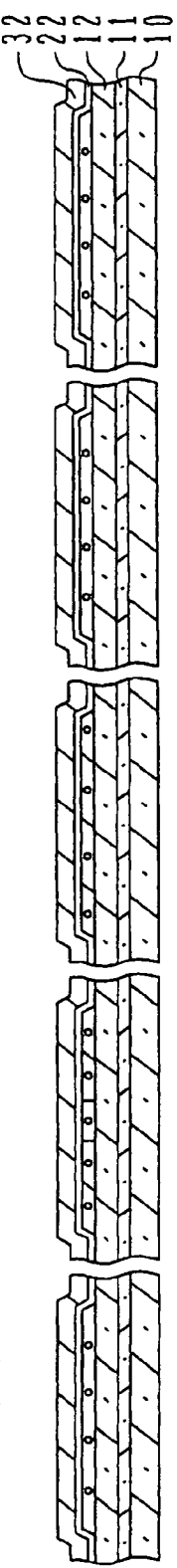
F I G. 3 (C)
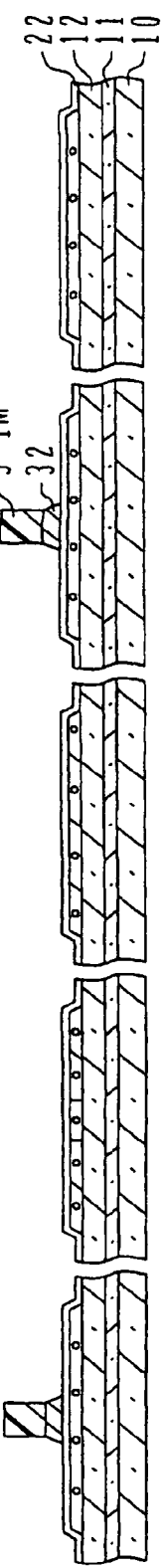
F I G. 3 (D)

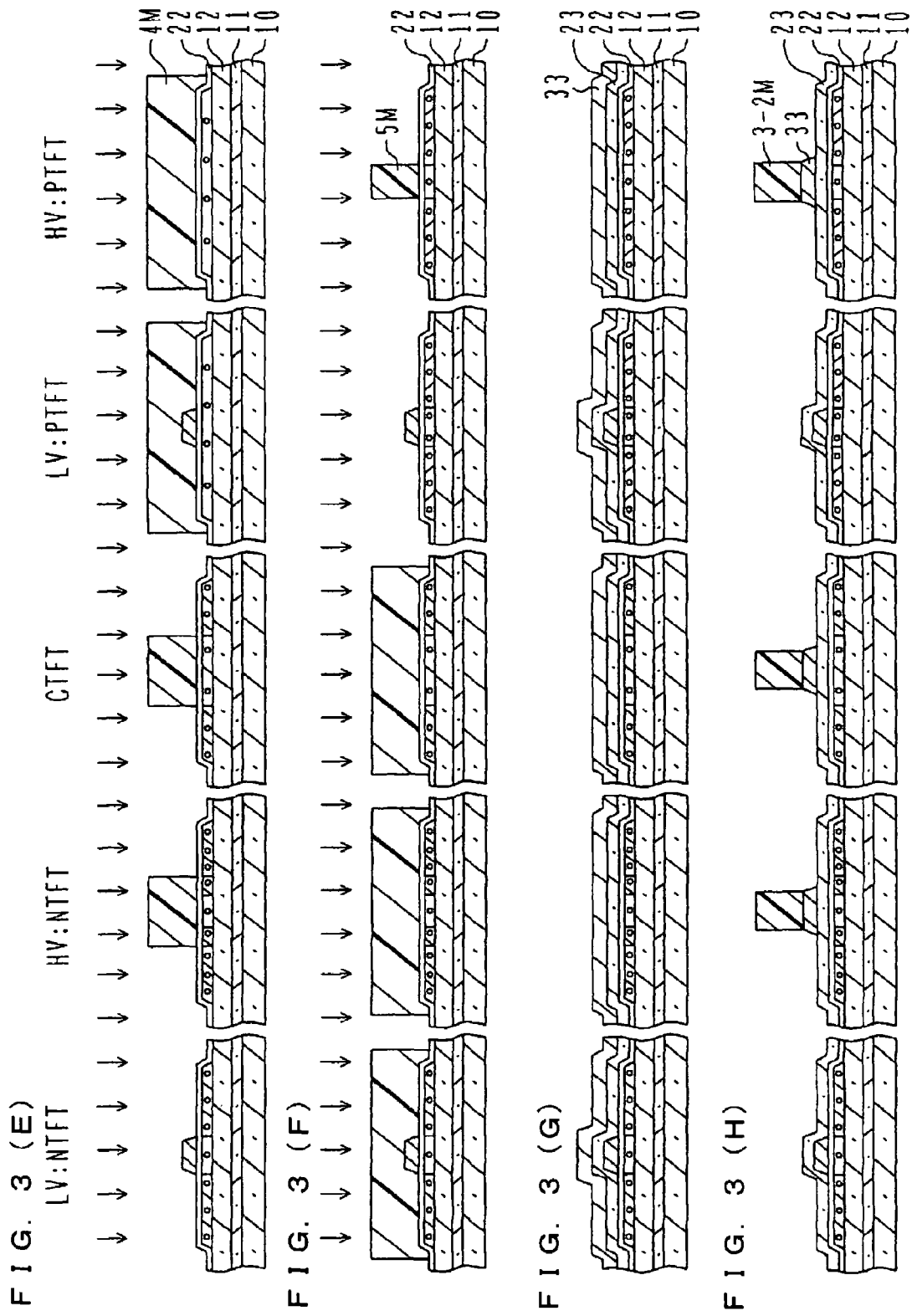

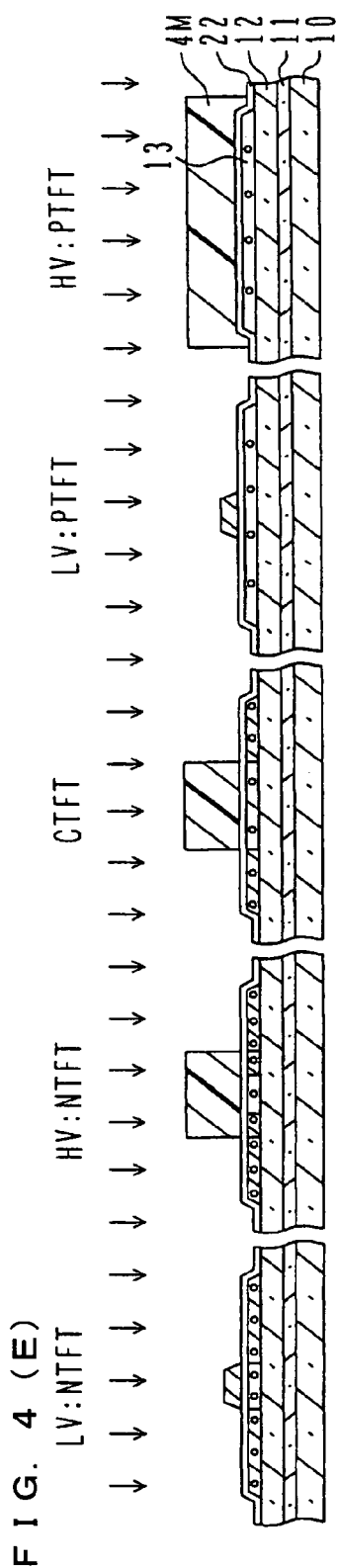
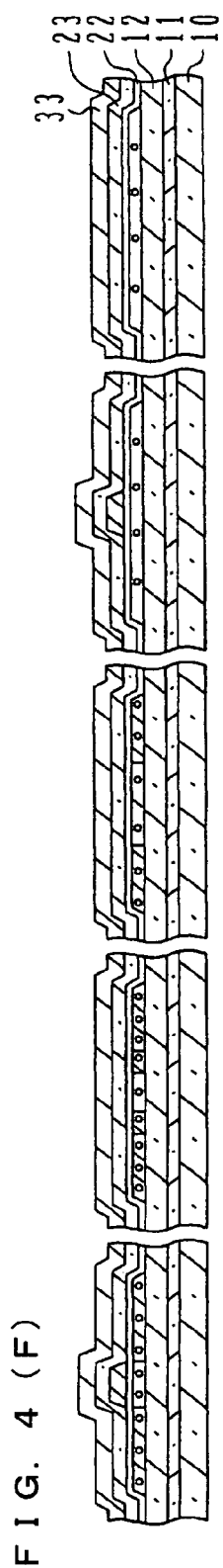
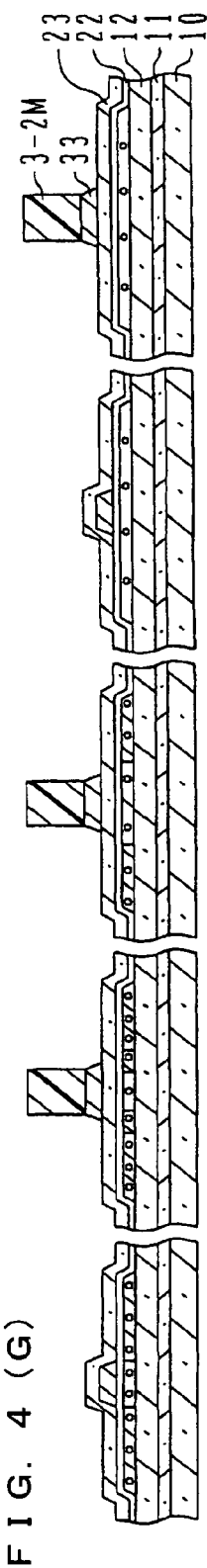
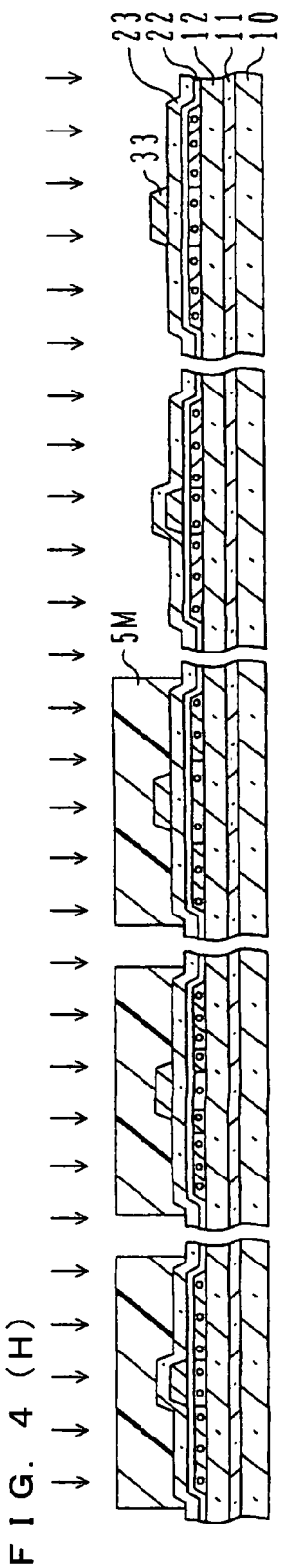
FIG. 4(E)
FIG. 4(F)
FIG. 4(G)
FIG. 4(H)

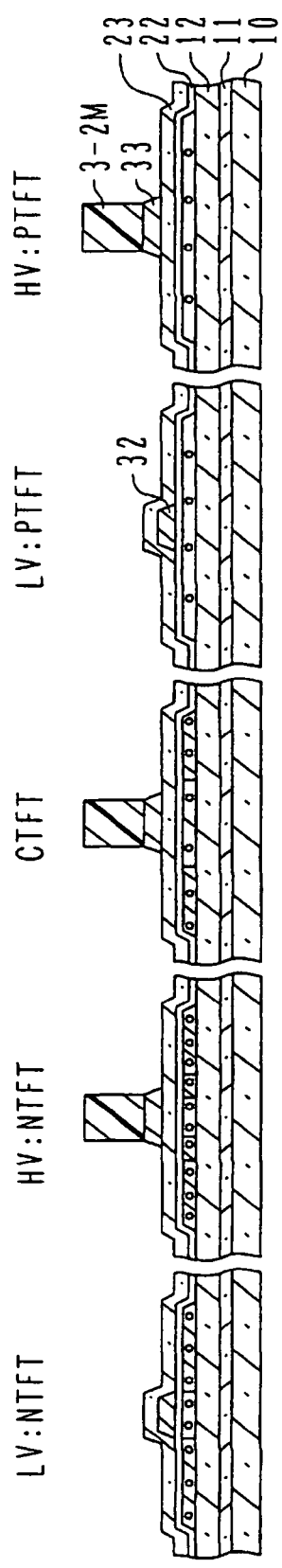
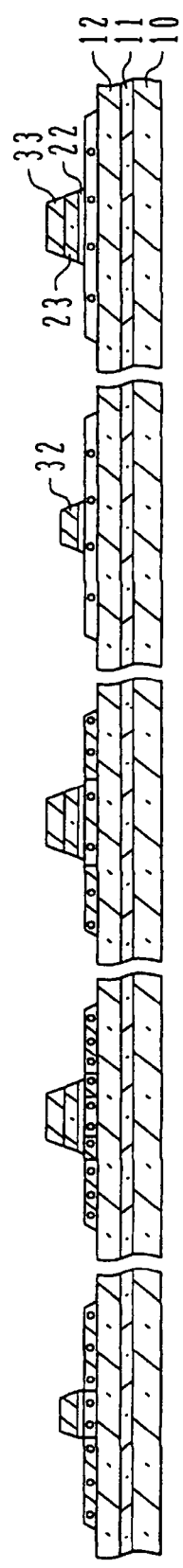
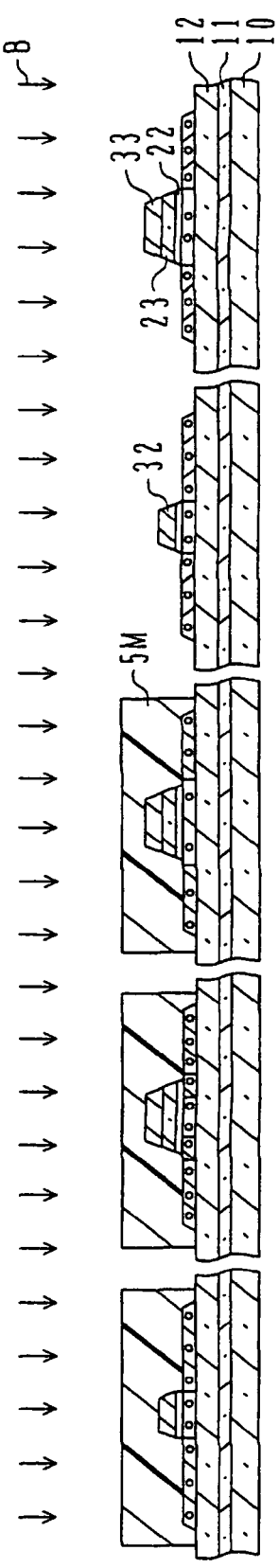
FIG. 5 (A)
FIG. 5 (B)
FIG. 5 (C)

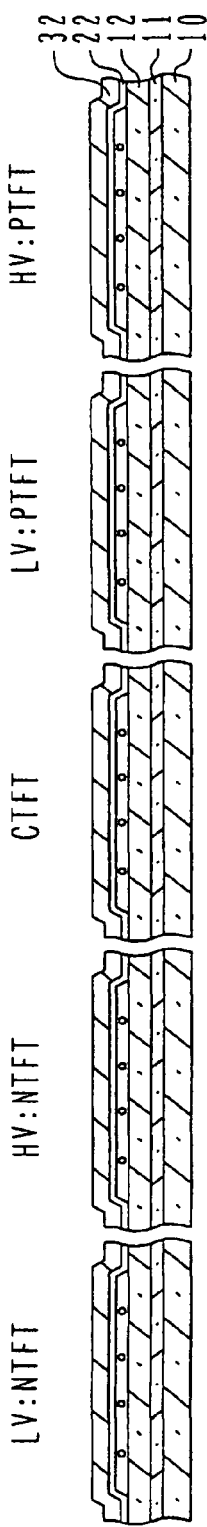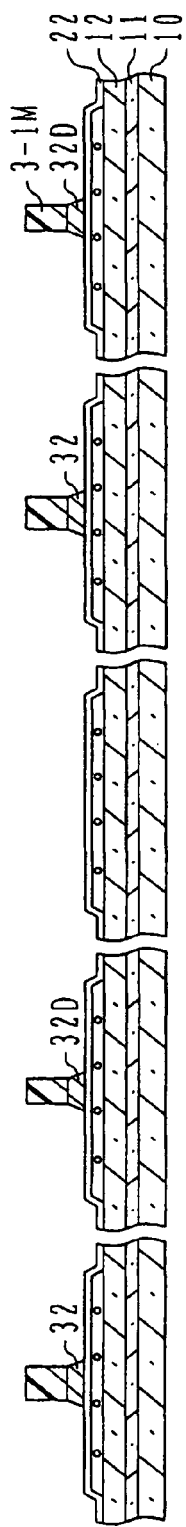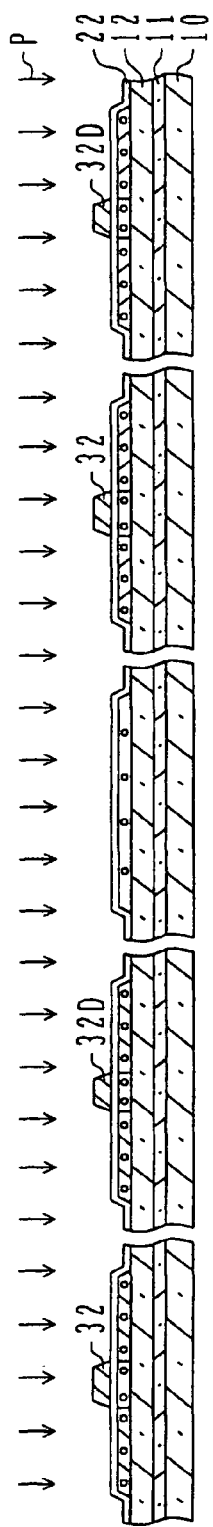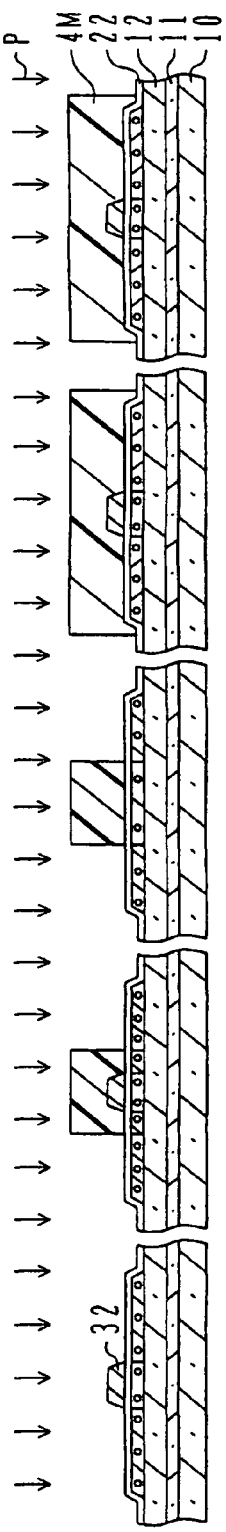

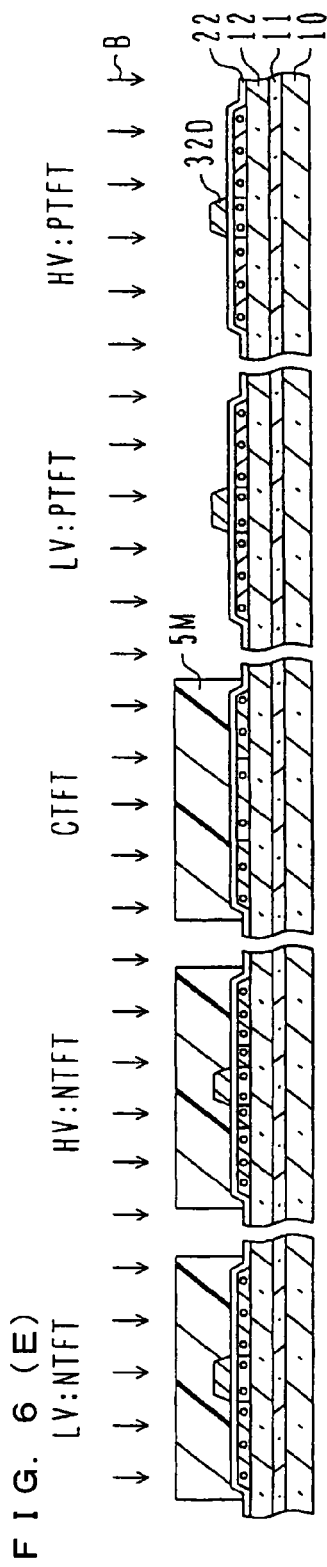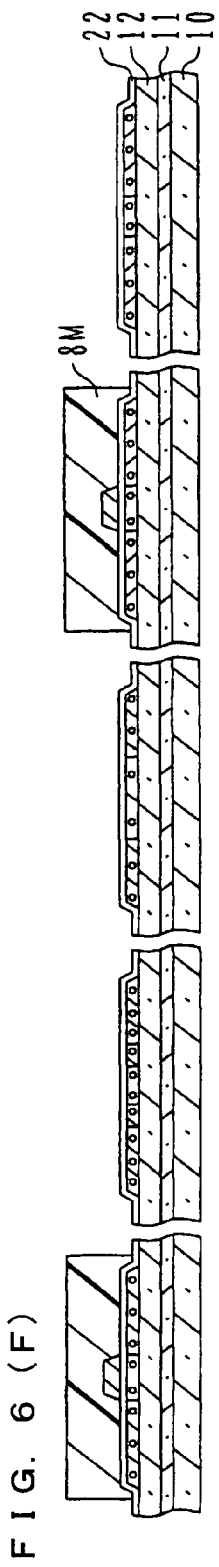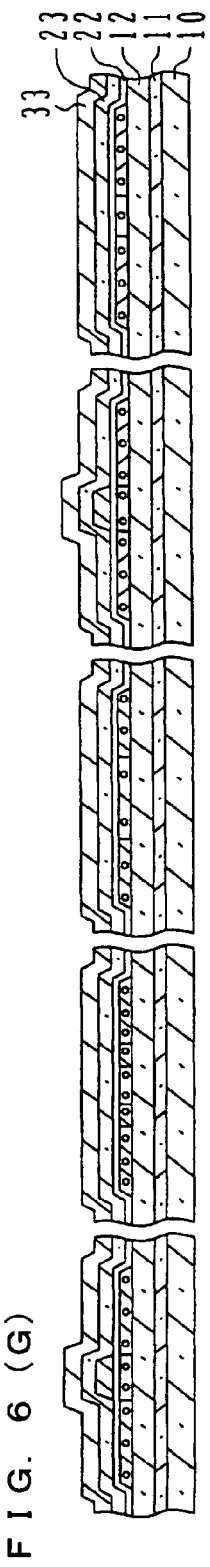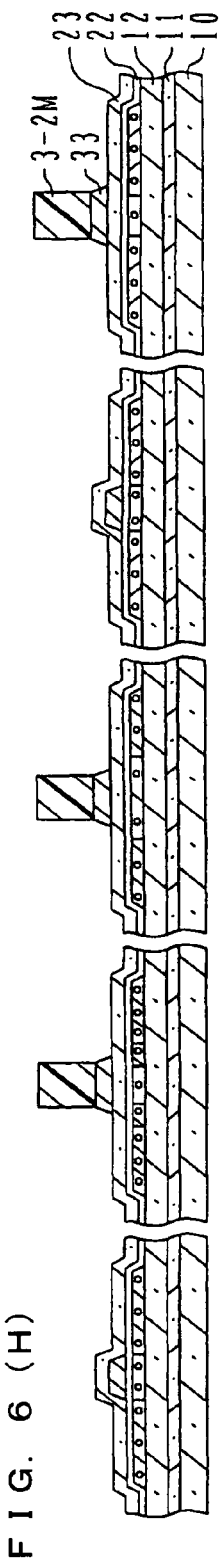

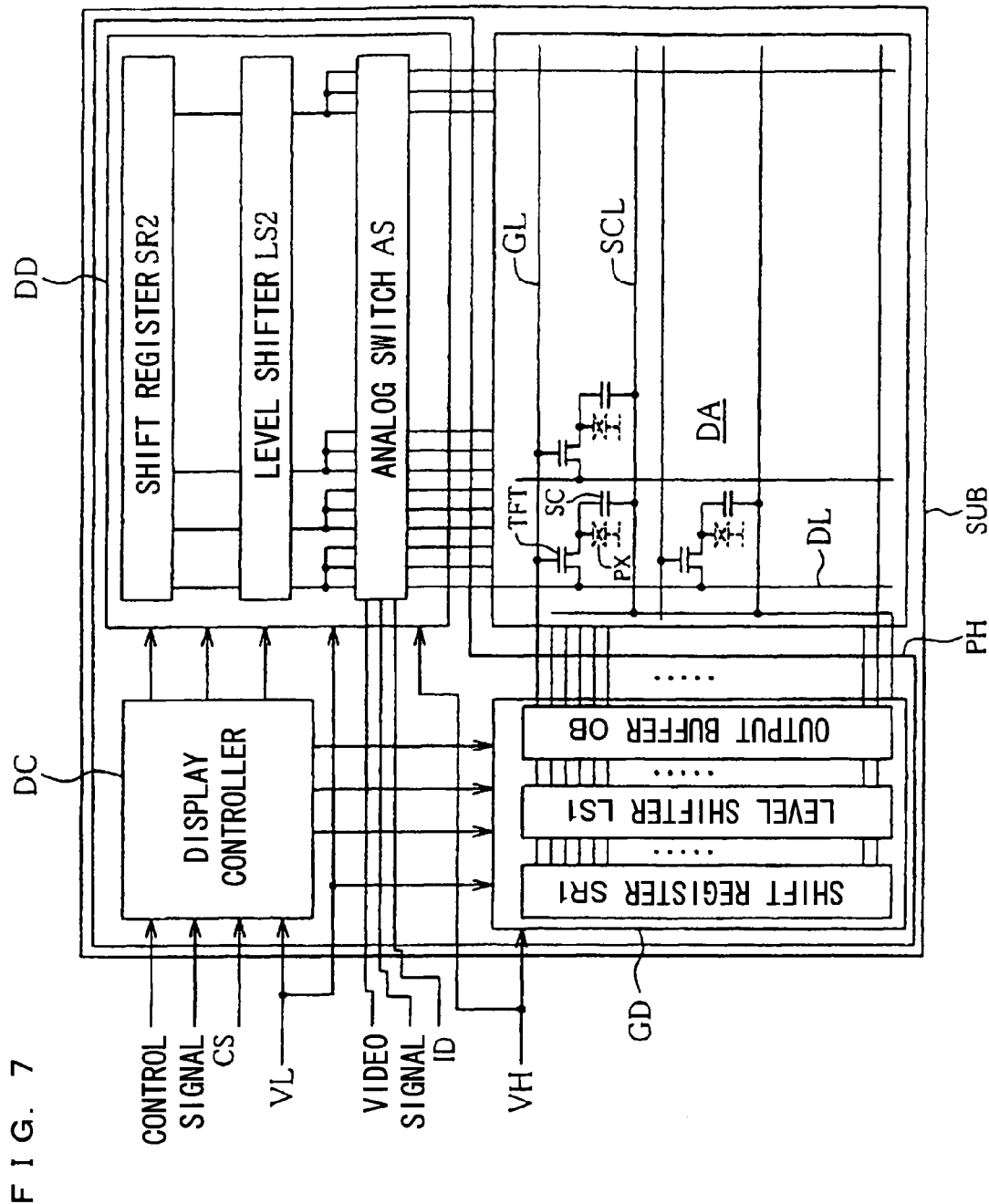

THIN FILM TRANSISTOR SUBSTRATE, LIQUID CRYSTAL DISPLAY DEVICE PROVIDED WITH SUCH THIN FILM TRANSISTOR SUBSTRATE AND METHOD FOR MANUFACTURING THIN FILM TRANSISTOR SUBSTRATE

This application is the U.S. national phase of International Application No. PCT/JP2006/309734 filed 16 May 2006 which designated the U.S. and claims priority to JP 2005-155058 filed 27 May 2005, the entire contents of each of which are hereby incorporated by reference.

TECHNICAL FIELD

The present invention relates to thin-film transistor substrates having peripheral circuits and short rings, and liquid crystal display devices provided with such thin-film transistor substrates. The invention also relates to a method for manufacturing such thin-film transistor substrates.

BACKGROUND ART

Liquid crystal display devices are thin, lightweight, and low power consuming. Owning to these and other characteristics, the liquid crystal display device has been widely used for a wide variety of devices as large as television sets and personal computers and as small as cameras, videos, portable phones, and portable terminals.

The liquid crystal display device is equipped with a liquid crystal panel. In a liquid crystal panel using polycrystalline (poly) silicon (p-Si) transistors as pixel transistors for driving pixels, peripheral driving circuits formed of p-Si TFT can be integrated in non-display areas.

The driving circuits of such liquid crystal display devices include components that preferably require fast operations, such as display controllers, shift registers, or the like, and components that preferably require high voltage resistance, such as output buffers, level shifters, analog switches, or the like. TFTs that require fast operation preferably have a short channel length and no LDD structure. On the other hand, TFTs that require high voltage resistance need to be voltage resistant rather than having fast operation. Pixel TFTs require high voltage resistance rather than fast operation. In order to withstand a required level of high voltage, such voltage-resistant TFTs preferably have a TFT structure with a gate insulating film of a sufficient thickness, and with a LDD (lightly doped drain, low-density region).

The pixel driving TFT preferably operates so that it writes data voltage when the gate voltage is ON and holds the data voltage until the next data voltage is written in. It is therefore preferable that the leak current be reduced as much as possible while the gate voltage is OFF. The leak current can be preferably reduced by providing a low-density region (lightly doped drain, LDD) between the channel of p-Si TFT and a low-resistant (high-density) source-drain region. For this reason, the pixel transistor is formed of n-channel TFT (NTFT), which performs better than p-channel TFT (PTFT).

The peripheral circuits include circuits such as high voltage-resistant input/output circuits and logic circuits. The logic circuit such as a shift register preferably requires fast operation. It is therefore preferable that the p-Si TFTs for the peripheral circuits be provided as high-voltage resistant transistors and fast-operating transistors. As such, the peripheral circuits are formed of complementary MOS (CMOS) TFTs using NTFT and PTFT.

In the following, description is made as to conventional techniques relating to TFT.

As described in the PRIOR ART section and other parts of Japanese Laid-Open Patent Publication No. 2000-299469 (published on Oct. 24, 2000), OFF current of p-Si TFT tends to increase, whereas ON current tends to decrease by the hot carrier effect. It is believed that the decrease of ON current occurs as the hot carrier generated by the strong electric field in the vicinity of the drain is trapped in a gate insulating film. In a GOLD (gate-drain overlapped LDD) structure in which the gate electrodes overlap the LDD region, the strong electric field in the vicinity of the drain is relieved and the hot carrier effect is attenuated. In order to provide the LDD region below the gate electrodes, the LDD region needs to be formed before forming the gate electrodes, using a mask.

The liquid crystal panel is formed using an insulating substrate such as glass. Because the substrate is insulating, the TFTs formed thereon are susceptible to destruction by static electricity. The substrate is protected from electrostatic discharge (ESD) by forming a wiring pattern called a "short ring," which shorts the ends of a date line (drain bus line) and a scan line (gate bus line), and which is removed before the fabrication of the liquid crystal panel completes. In a liquid crystal panel in which the peripheral circuits are integrated on a substrate, it is desirable to perform operation tests for the peripheral circuits. For this purpose, terminals to be used for the operation tests are drawn out from the peripheral circuits.

Japanese Laid-Open Patent Publication No. 202289/1999 (Tokukaihei 11-202289, published on Jul. 30, 1999) discloses a liquid crystal display device that allows for element evaluation without cutting the short line (short ring), and is capable of performing display without cutting the short line after the liquid crystal display device is fabricated. The influence of static electricity is also reduced in this liquid crystal display device. The foregoing publication realizes such a liquid crystal display device by proposing connecting the gate bus line and drain bus line to the short line via a connecting TFT, applying a high voltage across a gate and a source to electrically shift a threshold value, and turning on the connecting TFT during the fabrication process and turning off the connecting TFT during characteristics evaluation and after the fabrication. In an embodiment of this publication, amorphous silicon TFT is used and the peripheral circuits are not integrated.

Japanese Laid-Open Patent Publication No. 68110/1999 (Tokukaihei 11-68110, published on Mar. 9, 1999) discloses forming a plurality of aluminum short rings surrounding peripheral circuits and each active-matrix circuit provided on a single glass substrate, connecting the short rings with a Si thin film, and injecting impurities to the Si thin film when forming impurity regions in the TFTs of the active-matrix circuits and peripheral circuits.

Japanese Laid-Open Patent Publication No. 10116/2000 (Tokukai 2000-10116, published on Jan. 14, 2000) discloses an arrangement in which drain bus lines, gate bus lines, and peripheral circuit terminals for operation tests are drawn out to a non-display area, and are connected to a terminal wiring (short ring) using a resistance wiring made of polysilicon, as shown in FIG. 6 and described in conjunction with FIG. 6 for example. In the liquid crystal display device disclosed in this publication, the resistance of the resistance wiring is suitably selected, enabling testing to be properly carried out even without cutting the terminal wiring. The peripheral circuit and the short ring are disconnected from each other at the polysilicon resistance wiring, before fabrication of the panel is completed.

DISCLOSURE OF INVENTION

It is an object of the present invention to provide a thin-film transistor substrate that requires only a small number of fabrication steps for fabrication of normally-off and normally-on TFTs having a GOLD structure. The invention also provides a liquid crystal display device provided with such a thin-film transistor substrate, and a method for manufacturing the thin-film transistor substrate.

In order to achieve the foregoing object, a thin-film transistor substrate of the present invention includes: an insulating transparent substrate; a plurality of island-like semiconductor films formed above the insulating transparent substrate; an insulating gate electrode structure including (i) gate insulating films respectively formed on the island-like semiconductor films, and (ii) a gate electrode formed on each of the gate insulating films; a pair of source-drain regions of a first conductive type formed in regions on both sides of the insulating gate electrode structure in a first island-like semiconductor film and a second island-like semiconductor film included in the plurality of semiconductor films; a LDD region of the first conductive type, formed on inner sides of the pair of source-drain regions of the first island-like semiconductor film, partially covered with the gate electrode by leaving a channel region below the gate electrode, and having a lower impurity density than the pair of source-drain regions; and a normally-on channel region of the first conductive type, formed in the second island-like semiconductor film by being connected to the pair of source-drain regions, and having an impurity density substantially equal to the impurity density of the LDD region.

In order to achieve the foregoing object, a method for manufacturing a thin-film transistor substrate according to the present invention includes the steps of: (a) forming a plurality of island-like semiconductor films above an insulating transparent substrate; (b) forming gate insulating films on the island-like semiconductor films, respectively; (c) forming a LDD region of a first conductive type on both sides of a channel region that remains in a first island-like semiconductor film included in the plurality of island-like semiconductor films, and forming a normally-on channel region of the first conductive type, having an impurity density substantially equal to an impurity density of the LDD region, in a second island-like semiconductor film included in the plurality of island-like semiconductor films; (d) forming a first gate electrode on the gate insulating film, so as to partially cover the LDD region of the first island-like semiconductor film, and forming a second gate electrode above the normally-on channel region formed in areas other than both sides of the second island-like semiconductor film; and (e) forming a pair of source-drain regions of a first conductive type, having a higher impurity density than the LDD region, in regions on both sides of the gate electrode of the first island-like semiconductor film and the second island-like semiconductor film.

In order to achieve the foregoing object, a liquid crystal display device of the present invention includes the thin-film transistor substrate.

By sharing manufacturing steps, normally-off and normally-on TFTs having a GOLD structure can be manufactured with a small number of steps.

By connecting the peripheral circuit and the short ring using the normally-on transistor, adverse effects of static electricity can be reduced, and testing of the peripheral circuit can be properly performed.

BRIEF DESCRIPTION OF DRAWINGS

FIG. 1(A) is a plan view showing a structure of a thin-film transistor substrate according to one example of the present invention.

FIG. 1(B) is a block diagram showing the thin-film transistor substrate according to one example of the present invention.

FIG. 1(C) is a graph representing an example of characteristics of TFTs of the thin-film transistor substrate according to one example of the present invention.

FIG. 1(D) is a cross sectional view showing a relevant part in a step of a manufacturing method of a thin-film transistor substrate according to a first example of the present invention.

FIG. 1(E) is a cross sectional view showing a relevant part in the step after the step of FIG. 1(D) in the manufacturing method of the thin-film transistor substrate according to the first example of the present invention.

FIG. 1(F) is a cross sectional view showing a relevant part in the step after the step of FIG. 1(E) in the manufacturing method of the thin-film transistor substrate according to the first example of the present invention.

FIG. 1(G) is a cross sectional view showing a relevant part in the step after the step of FIG. 1(F) in the manufacturing method of the thin-film transistor substrate according to the first example of the present invention.

FIG. 1(H) is a cross sectional view showing a relevant part in the step after the step of FIG. 1(G) in the manufacturing method of the thin-film transistor substrate according to the first example of the present invention.

FIG. 1(I) is a cross sectional view showing a relevant part in the step after the step of FIG. 1(H) in the manufacturing method of the thin-film transistor substrate according to the first example of the present invention.

FIG. 1(J) is a cross sectional view showing a relevant part in the step after the step of FIG. 1(I) in the manufacturing method of the thin-film transistor substrate according to the first example of the present invention.

FIG. 1(K) is a cross sectional view showing a relevant part in the step after the step of FIG. 1(J) in the manufacturing method of the thin-film transistor substrate according to the first example of the present invention.

FIG. 1(L) is a cross sectional view showing a relevant part in the step after the step of FIG. 1(K) in the manufacturing method of the thin-film transistor substrate according to the first example of the present invention.

FIG. 1(M) is a cross sectional view showing a relevant part in the step after the step of FIG. 1(L) in the manufacturing method of the thin-film transistor substrate according to the first example of the present invention.

FIG. 1(N) is a cross sectional view showing a relevant part in the step after the step of FIG. 1(M) in the manufacturing method of the thin-film transistor substrate according to the first example of the present invention.

FIG. 1(O) is a cross sectional view showing a relevant part in the step after the step of FIG. 1(N) in the manufacturing method of the thin-film transistor substrate according to the first example of the present invention.

FIG. 1(P) is a cross sectional view showing a relevant part in the step after the step of FIG. 1(O) in the manufacturing method of the thin-film transistor substrate according to the first example of the present invention.

FIG. 1(Q) is a cross sectional view showing a relevant part in the step after the step of FIG. 1(P) in the manufacturing method of the thin-film transistor substrate according to the first example of the present invention.

FIG. 2(A) is a cross sectional view showing a relevant part in a step of a manufacturing method of a thin-film transistor substrate according to a modification example of the first example of the present invention.

FIG. 2(B) is a cross sectional view showing a relevant part in the step after the step of FIG. 2(A) in the manufacturing method of the thin-film transistor substrate according to the modification example of the first example of the present invention.

FIG. 2(C) is a cross sectional view showing a relevant part in the step after the step of FIG. 2(B) in the manufacturing method of the thin-film transistor substrate according to the modification example of the first example of the present invention.

FIG. 2(D) is a cross sectional view showing a relevant part in the step after the step of FIG. 2(C) in the manufacturing method of the thin-film transistor substrate according to the modification example of the first example of the present invention.

FIG. 2(E) is a cross sectional view showing a relevant part in the step after the step of FIG. 2(D) in the manufacturing method of the thin-film transistor substrate according to the modification example of the first example of the present invention.

FIG. 2(F) is a cross sectional view showing a relevant part in the step after the step of FIG. 2(E) in the manufacturing method of the thin-film transistor substrate according to the modification example of the first example of the present invention.

FIG. 2(G) is a cross sectional view showing a relevant part in the step after the step of FIG. 2(F) in the manufacturing method of the thin-film transistor substrate according to the modification example of the first example of the present invention.

FIG. 2(H) is a cross sectional view showing a relevant part in the step after the step of FIG. 2(G) in the manufacturing method of the thin-film transistor substrate according to the modification example of the first example of the present invention.

FIG. 3(A) is a cross sectional view showing a relevant part in a step of a manufacturing method of a thin-film transistor substrate according to a second example of the present invention.

FIG. 3(B) is a cross sectional view showing a relevant part in the step after the step of FIG. 3(A) in the manufacturing method of the thin-film transistor substrate according to the second example of the present invention.

FIG. 3(C) is a cross sectional view showing a relevant part in the step after the step of FIG. 3(B) in the manufacturing method of the thin-film transistor substrate according to the second example of the present invention.

FIG. 3(D) is a cross sectional view showing a relevant part in the step after the step of FIG. 3(C) in the manufacturing method of the thin-film transistor substrate according to the second example of the present invention.

FIG. 3(E) is a cross sectional view showing a relevant part in the step after the step of FIG. 3(D) in the manufacturing method of the thin-film transistor substrate according to the second example of the present invention.

FIG. 3(F) is a cross sectional view showing a relevant part in the step after the step of FIG. 3(E) in the manufacturing method of the thin-film transistor substrate according to the second example of the present invention.

FIG. 3(G) is a cross sectional view showing a relevant part in the step after the step of FIG. 3(F) in the manufacturing method of the thin-film transistor substrate according to the second example of the present invention.

FIG. 3(H) is a cross sectional view showing a relevant part in the step after the step of FIG. 3(G) in the manufacturing method of the thin-film transistor substrate according to the second example of the present invention.

FIG. 4(E) is a cross sectional view showing a relevant part in the step after the step of FIG. 4(D) in the manufacturing method of the thin-film transistor substrate according to the first modification example of the second example of the present invention.

FIG. 4(F) is a cross sectional view showing a relevant part in the step after the step of FIG. 4(E) in the manufacturing method of the thin-film transistor substrate according to the first modification example of the second example of the present invention.

FIG. 4(G) is a cross sectional view showing a relevant part in the step after the step of FIG. 4(F) in the manufacturing method of the thin-film transistor substrate according to the first modification example of the second example of the present invention.

FIG. 4(H) is a cross sectional view showing a relevant part in the step after the step of FIG. 4(G) in the manufacturing method of the thin-film transistor substrate according to the first modification example of the second example of the present invention.

FIG. 5(A) is a cross sectional view showing a relevant part in a step of a manufacturing method of a thin-film transistor substrate according to a second modification example of the second example of the present invention.

FIG. 5(B) is a cross sectional view showing a relevant part in the step after the step of FIG. 5(A) in the manufacturing method of the thin-film transistor substrate according to the second modification example of the second example of the present invention.

FIG. 5(C) is a cross sectional view showing a relevant part in the step after the step of FIG. 5(B) in the manufacturing method of the thin-film transistor substrate according to the second modification example of the second example of the present invention.

FIG. 6(A) is a cross sectional view showing a relevant part in a step of a manufacturing method of a thin-film transistor substrate according to a third example of the present invention.

FIG. 6(B) is a cross sectional view showing a relevant part in the step after the step of FIG. 6(A) in the manufacturing method of the thin-film transistor substrate according to the third example of the present invention.

FIG. 6(C) is a cross sectional view showing a relevant part in the step after the step of FIG. 6(B) in the manufacturing method of the thin-film transistor substrate according to the third example of the present invention.

FIG. 6(D) is a cross sectional view showing a relevant part in the step after the step of FIG. 6(C) in the manufacturing method of the thin-film transistor substrate according to the third example of the present invention.

FIG. 6(E) is a cross sectional view showing a relevant part in the step after the step of FIG. 6(D) in the manufacturing method of the thin-film transistor substrate according to the third example of the present invention.

FIG. 6(F) is a cross sectional view showing a relevant part in the step after the step of FIG. 6(E) in the manufacturing method of the thin-film transistor substrate according to the third example of the present invention.

FIG. 6(G) is a cross sectional view showing a relevant part in the step after the step of FIG. 6(F) in the manufacturing method of the thin-film transistor substrate according to the third example of the present invention.

FIG. 6(H) is a cross sectional view showing a relevant part in the step after the step of FIG. 6(G) in the manufacturing method of the thin-film transistor substrate according to the third example of the present invention.

FIG. 7 is a plan view showing an exemplary structure of an active-matrix substrate of a liquid crystal display device.

Figure 4A:
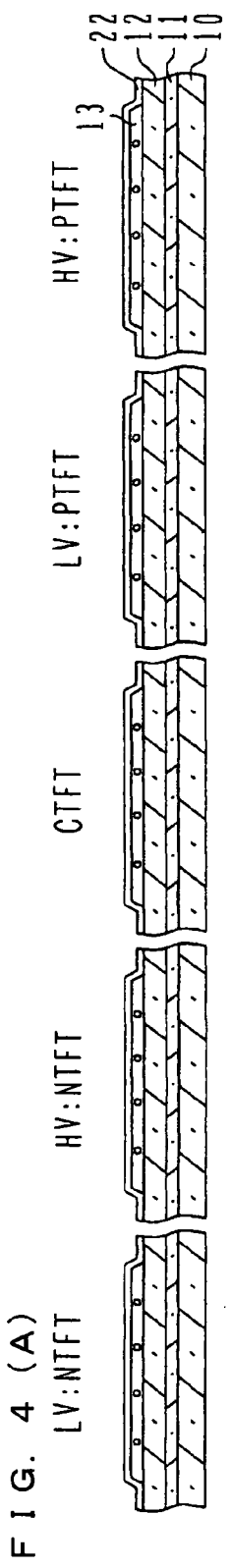
FIG. 4(A) is a cross sectional view showing a relevant part in a step of a manufacturing method of a thin-film transistor substrate according to a first modification example of the second example of the present invention.

REFERENCE NUMERALS 10 glass substrate (transparent insulating substrate)
11 silicon nitride film
12 silicon oxide film
13 silicon film
21 silicon oxide film (gate insulating film)
22 silicon oxide film (first gate insulating film)
23 silicon oxide film (second gate insulating film)
31 gate electrode film (Al—Nd film)
31a gate electrode
32 first gate electrode film (Al—Nd film)
32a first gate electrode
33 second gate electrode film (Al—Nd film)
33a second gate electrode
61 interlayer insulating film
71 source-drain electrode film
81 transparent resin film
91 transparent electrode
DA display area
GL gate line
DL data line
TFT thin-film transistor
PH peripheral circuit
GD gate driver
DD data driver
DC display controller
SR shift register
LS level shifter
OB output buffer
AS analog switch

BEST MODE FOR CARRYING OUT THE INVENTION

Figure 4B:
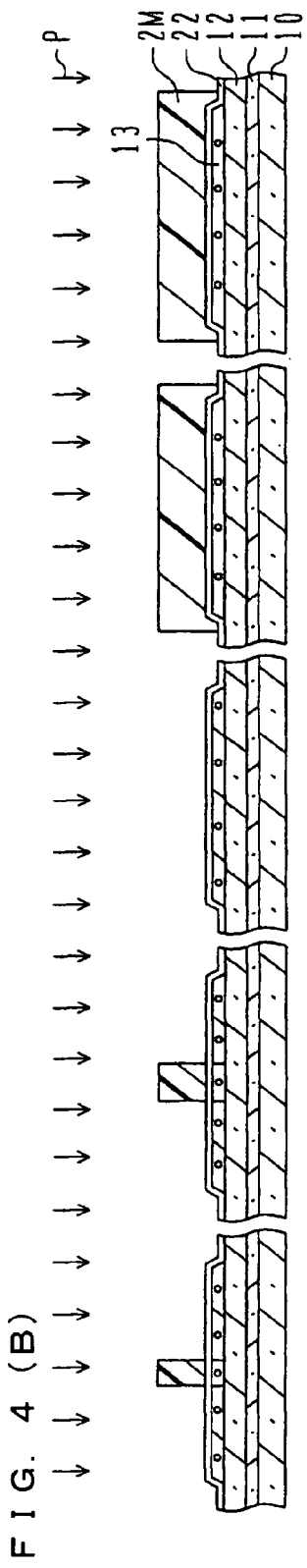
FIG. 4(B) is a cross sectional view showing a relevant part in the step after the step of FIG. 4(A) in the manufacturing method of the thin-film transistor substrate according to the first modification example of the second example of the present invention.
Figure 4C:
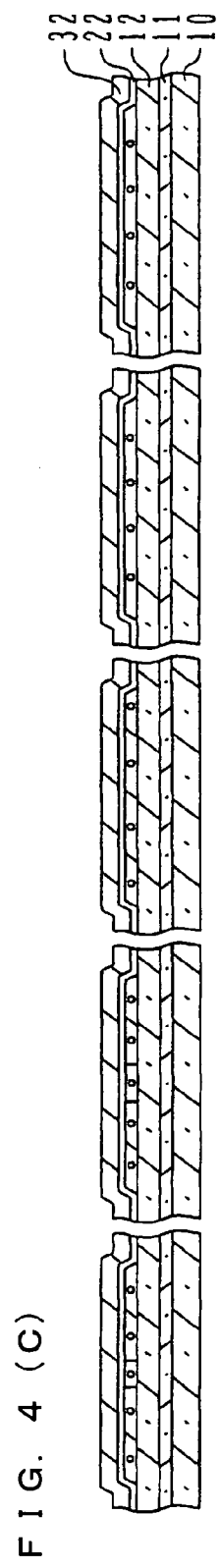
FIG. 4(C) is a cross sectional view showing a relevant part in the step after the step of FIG. 4(B) in the manufacturing method of the thin-film transistor substrate according to the first modification example of the second example of the present invention.
Figure 4D:
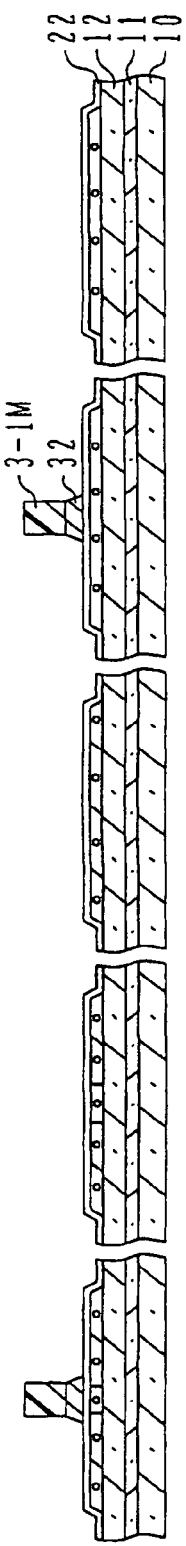
FIG. 4(D) is a cross sectional view showing a relevant part in the step after the step of FIG. 4(C) in the manufacturing method of the thin-film transistor substrate according to the first modification example of the second example of the present invention.
Figure 8:
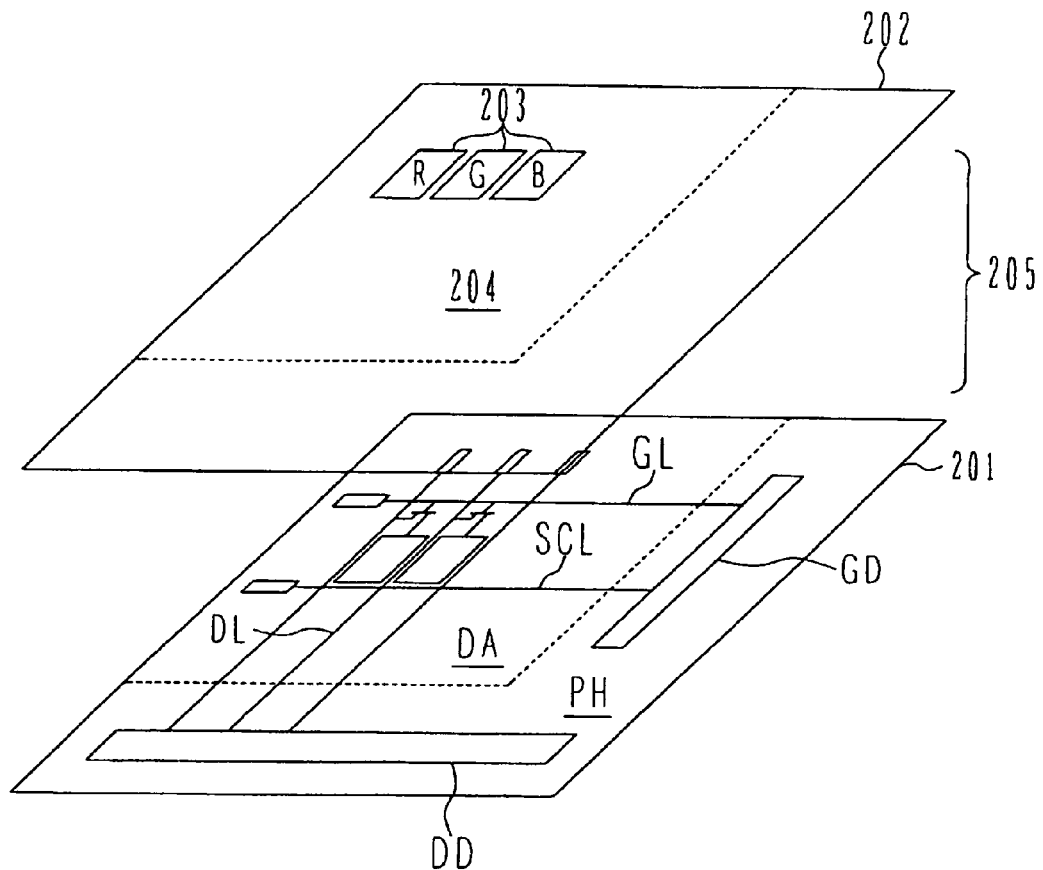
FIG. 8(A) is a perspective view showing an exemplary structure of a display device.
FIG. 8(B) is a cross sectional view showing an exemplary structure of the display device.
Figure 8:
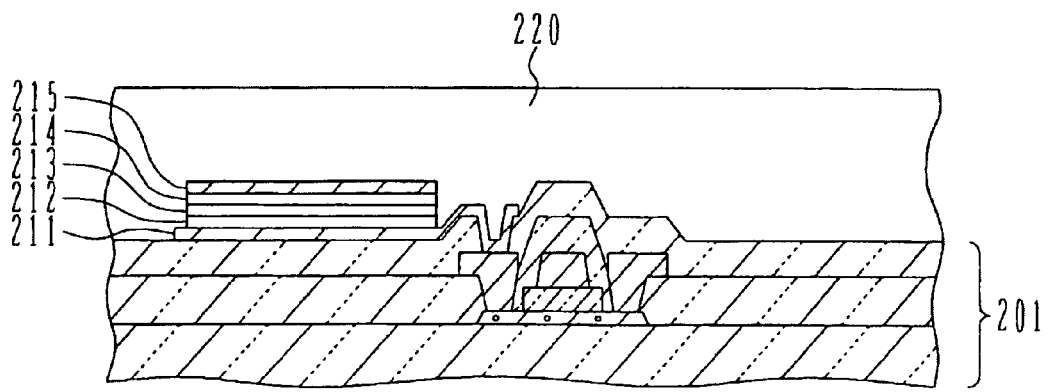

The following will describe one embodiment of the present invention with reference to FIG. 1 through FIG. 8.

First, with reference to FIG. 7, description is made as to an exemplary structure of a liquid crystal display device using a thin-film transistor substrate of the present embodiment as an active-matrix substrate.

In the liquid crystal display device, a display area DA for performing display is formed on an insulating transparent substrate SUB such as a glass substrate, along with a peripheral circuit (PH) area. A short ring and interconnect wirings have been removed.

In the display area DA, a plurality of scan gate lines (bus lines) GL extends in a row (horizontal) direction, and a plurality of video data lines (bus lines) DL extends in a column (vertical) direction.

A thin-film transistor TFT is connected at each intersection of the scan gate lines GL and the video data lines DL. The thin-film transistor TFT has an output terminal connected to a pixel electrode PX formed of a transparent electrode such as ITO. Each pixel electrode PX is connected to an auxiliary capacitor SC. The other electrode of the auxiliary capacitor SC is connected to an auxiliary capacitor line (bus line) SCL held at a constant potential. Note that, in the structure shown in FIG. 7, the auxiliary capacitor lines SCL extend in a row direction. However, the auxiliary capacitor lines SCL may be configured to extend in a column direction.

In the peripheral circuit (PH) area, there are provided a gate driver GD for generating a set of scan signals to be supplied to the scan gate lines, a data driver DD for producing video data to be supplied to the video data lines, and a display controller DC for controlling the gate driver GD and the data driver DD with an externally supplied control signals CS.

The gate driver GD includes a shift register SR1, a level shifter LS1, and an output buffer OB, etc. The data driver DD includes a shift register SR2, a level shifter LS2, and an analog switch AS, etc. Reference voltages VL, VH, and video signals ID are externally supplied. The display controller DC may be provided by externally connecting an integrated circuit chip.

In the active-matrix substrate with the integrated peripheral circuits (PH), relatively fast operations are required for the display controller DC and the shift registers SR1 and SR2. The level shifters LS1, LS2, the output buffer OB, and the analog switch AS are required to operate under relatively high voltages (high voltage resistance is required), and a strong driving capability is desired for these circuit elements.

The switching thin-film transistor (TFT) used in the display area requires relatively high voltage resistance. For example, driving circuit TFTs and pixel TFTs are formed of high voltage resistant TFTs. The TFTs in the display DA may be solely made up of n-channel TFTs. However, it is preferable that the peripheral circuit PH be realized by a CMOS circuit. As such, in addition to the n-channel TFT, the p-channel TFT is formed as well. Circuits using polycrystalline silicon for display devices generally use the MOS capacitor as the auxiliary capacitor.

As described above, the TFTs of the liquid crystal display device with the integrated peripheral circuits include different types of TFTs: those preferably requiring fast operations; those with high voltage resistance and strong driving capability; and those with high voltage resistance and preferably requiring low leak current as represented by the pixel TFT.

With reference to FIGS. 1(A), 1(B), and 1(C), the following will describe a structure of a thin-film transistor substrate for liquid crystal display devices. The thin-film transistor substrate will be described as a common substrate for all examples of the present invention.

FIG. 1(A) is a plan view schematically illustrating a thin-film transistor substrate for one panel. On a glass substrate 10, the thin-film transistor substrate includes: a display area DA including large numbers of pixels; a gate peripheral circuit PH1 disposed on the left-hand side of the display area DA; a drain peripheral circuit PH2 disposed on the upper side of the display area DA; and a short ring SR disposed around these circuit elements. The peripheral circuits PH1 and PH2 may be collectively referred to as peripheral circuits PH.

FIG. 1(B) is a block diagram showing a structure at an interconnecting portion between the peripheral circuit PH and the short ring SR. Input/output nodes of the peripheral circuit PH is connected to test terminals TP, and to the short ring SR via interconnecting (thin-film) transistors CTFT serving as switches. A gate electrode of each interconnecting transistor CTFT is connected to a (ON/OFF) control terminal CP.

The interconnecting transistor CTFT is a normally-on transistor, which, when the control terminal is in a floating state, connects the peripheral circuit PH to the short ring SR to protect the peripheral circuit PH from static electricity. When a reverse bias voltage is applied to the control terminal CP, the interconnecting transistor CTFT is turned OFF to electrically disconnect the peripheral circuit PF from the short ring SR. Testing of the peripheral circuit PH is possible under these conditions via the test terminal TP. It is preferable that the short ring SR is connected at the same potential. However, the shape of the short ring SR is not necessarily limited to the loop.

By providing the control terminal CP for each test terminal TP, interconnections to the short ring SR can be individually controlled. Interconnections of several test terminals TP may be controlled together. In this case, the gate electrodes of several interconnecting transistors CTFTs may be connected together to one of the control terminals CP, as indicated by the broken line.

Note that, the gate lines and the video data lines may be directly connected to the short ring SR via only the interconnecting transistors CTFTs, by skipping the test terminals TP. In this case, ON/OFF control of the interconnecting transistors CTFTs may be performed together.

FIG. 1(C) represents exemplary characteristics of TFT. The horizontal axis represents gate voltage Vg, and the vertical axis represents drain current Id. Characteristic c1 represents a characteristic of the n-channel transistors NTFT in the display area and the peripheral circuits. The n-channel transistors NTFT are OFF at the gate voltage of 0, and are turned ON when a positive gate voltage is applied. This is the characteristic of ordinary n-channel transistors. Characteristic c2 represents a characteristic of the n-channel interconnecting transistors CTFT. The n-channel interconnecting transistors CTFT are turned OFF when a negative gate voltage is applied, and are turned ON at positive gate voltages in the vicinity of 0, i.e., the normally-on characteristic.

In order to change the characteristic of n-channel transistor from c1 to c2, the channel region needs to be doped with n-type impurity at an appropriate density. Here, doping of the n-type impurity at high density makes it difficult or impossible to turn off the transistor. For this reason, the n-type impurity is doped at such a low density that an appropriate conductivity is obtained. At the time of forming the LDD region in the thin-film transistor of a GOLD structure, the gate electrodes have not been formed, allowing the channel to be doped with the impurity. Doping of the LDD in the TFT having a GOLD structure can be performed simultaneously with the channel doping of the interconnecting transistors CTFT. That is, no extra step is required for the channel doping.

The following will describe a manufacturing method of a thin-film transistor substrate according to a first example of the present invention, with reference to FIGS. 1(D), 1(E), 1(F), 1(G), 1(H), 1(I), 1(J), 1(K), 1(L), 1(M), 1(N), 1(O), 1(P), and 1(Q).

The display area DA shown in FIG. 1(A) requires n-channel pixel (PIX) transistors PIX:NTFT that are resistant to relatively high voltages. The peripheral circuits PH require high-voltage-resistant transistors like pixel transistors. The peripheral circuits PH also require high-speed (HS) n-channel transistors HS:NTFT, p-channel transistors PTFT, and interconnecting transistors CTFTs for making interconnections to the short ring. In the following, these 4 kinds of transistors HS:NTFT, PIX:NTFT, CTFT, and PTFT will be described side by side. In FIG. 1(D), HS:NTFT, PIX:NTFT, CTFT, and PTFT are shown in this order from the left, for example.

First, as shown in FIG. 1(D), a polycrystalline semiconductor film is formed on a substrate via a base layer. For example, as base insulating films, a silicon nitride film 11 having a thickness of, for example, 50 nm and a silicon oxide film 12 having a thickness of, for example, 200 nm are deposited on a glass substrate 10 by plasma CVD (PE-CVD). Then, an amorphous silicon film 13 having a thickness of 40 nm is deposited thereon. The amorphous silicon film 13 is irradiated with an excimer laser beam EXL to form a polycrystalline film. Where possible, a polycrystalline semiconductor film may be formed directly.

Next, as shown in FIG. 1(E), the polycrystalline semiconductor film is patterned into the shapes of the respective transistors. For example, a photoresist film is coated on the polycrystalline silicon film 13, and a resist pattern 1M of a predetermined shape is formed by exposure and development. Using the resist pattern 1M as a mask, the polycrystalline silicon film 13 is dry-etched with a fluorocarbon gas (for example, freon gas) as an etchant gas. The resist pattern 1M is then released (removed) with a releasing liquid (resist remover) or the like.

Thereafter, as shown in FIG. 1(F), a silicon oxide film 21 having a thickness of, for example, 110 nm is deposited on the glass substrate 10 by plasma CVD, so as to cover the silicon film 13 that has been patterned.

Next, as shown in FIG. 1(G), low-density doping of n-type impurity is performed in the LDD region of the pixel transistors PIX:NTFT having a GOLD structure, and in the channel region of the interconnecting transistors CTFTs. Note that, no LDD region is formed for the high-speed transistors HS:NTFT. The p-type transistors PTFT are not doped with the n-type impurity.

Specifically, a photoresist film is coated on the gate insulating film 21, and is exposed and developed to cover portions including the high-speed transistors HS:NTFT, the p-channel transistors PTFT, and the channel region of the pixel transistors PIX:NTFT forming the GOLD structure (opening is formed in a portion defining the LDD). As a result, a resist pattern 2M is formed that has an opening in at least the channel region of the interconnecting transistors CTFT (for example, the entire region of the interconnecting transistors CTFT). This is followed by high-density n-type impurity doping in a region which may or may not be doped.

Then, using the resist pattern 2M as a mask, the LDD region of the pixel transistors PIX:NTFT and the channel region of the interconnecting transistors CTFT are doped with low-density n-type impurity through the gate insulating film 21. For example, using an ion doping device, phosphorus P ions are injected at an acceleration energy of 90 keV, and a dose of $5 \times 10^{13}$ cm$^{-2}$ (hereinafter, denoted by the notation such as 5E13). The resist pattern 2M is released thereafter.

Here, the channel region of the interconnecting transistors CTFT is doped with the n-type impurity. This shifts the threshold voltage to a negative (−) value, and a normally-on channel is formed. The positive threshold value is maintained in the other n-channel transistors not doped with the n-type impurity. Since the channel doping is performed simultaneously with the LDD doping of the GOLD structure, no extra manufacturing step is required.

Next, as shown in FIG. 1(H), an Al—Nd film of, for example, 300 nm thick is formed as a gate electrode film 31 on the gate insulating film 21 by sputtering. If there is a margin in the wire resistance of the gate lines, the gate electrodes (and gate lines) may be formed using a high-melting point metal such as Mo.

Thereafter, as shown in FIG. 1(I), a resist pattern 3M having the shape of the gate electrodes (and gate lines) is formed on the gate electrode film 31. Using the resist pattern 3M as a mask, the gate electrode film 31 is patterned. For example, wet etching is performed using a phosphoric/nitric etchant. The resist pattern 3M is released thereafter.

Then, as shown in FIG. 1(J), n-type impurity doping is performed in a high-density source-drain region of the n-channel transistors. Specifically, a resist pattern 4M is formed that covers the entire region of the p-channel transistors PTFT, n-channel transistors PIX:NTFT forming the LDD region, and the gate electrodes 31a of the CTFT. The resist pattern 4M also has overhang portions that extend a predetermined distance on the both sides of the gate electrode 31a. Next, using the resist pattern 4M and the gate electrode 31a as masks, the polycrystalline semiconductor film (silicon film) 13 is doped with high-density n-type impurity through the gate insulating film 21. For example, using an ion doping device, n-type impurity phosphorus P ions are injected at an acceleration energy of 90 keV, and a dose of 1.5E15. The resist pattern 4M is released thereafter.

In the pixel transistors PIX:NTFT, a high-density source-drain region is formed in an area separated from the gate electrode 31a by a predetermined distance. The LDD region is formed over a region below the gate electrode and within the predetermined distance from the gate electrode 31a. This realizes a high-voltage-resistant and low-leak-current GOLD structure. On the other hand, in the interconnecting transistors CTFT, the low density region remains outside of the gate electrode to increase voltage resistance. In the high-speed n-channel transistors HS:NTFT, the high-density source-drain region is formed without a distance from the gate electrode 31a. This realizes the high-speed transistors. As a result, an n-channel TFT structure is formed.

Thereafter, as shown in FIG. 1(K), p-type impurity doping is performed to form a source-drain region in the p-channel transistors PTFT. Specifically, a resist pattern 5M is formed that covers the n-channel transistors, and a p-type impurity, for example, such as boron B ions are injected at an acceleration energy of 70 keV and a dose of 1.5E15, using an ion doping device. The resist pattern 5M is released thereafter.

This is followed by, for example, irradiation of an excimer laser to activate the doped impurity. In the case where the high-melting-point metal is used for the gate lines, irradiation of an excimer laser may detach the gate lines. For this reason, heat activation is mode preferable. For example, the impurity is activated by performing annealing for about 2 hours at 450° C. to 550° C. in a N$_2$ atmosphere.

Next, as shown in FIG. 1(L), for example, a silicon nitride film 61 having a thickness of 370 nm is deposited as an interlayer insulating film on the gate insulating film 21, so as to cover the gate electrode 31a. This is performed by plasma CVD using silane and ammonia, for example. Here, the nitrogen source gas, such as ammonia, used to deposit the silicon nitride film contains hydrogen. The resulting silicon nitride film also contains hydrogen. As the interlayer insulating film, silicon oxide may be used as well.

Then, as shown in FIG. 1(M), a resist pattern 6M is formed that has an opening in the contact region. The interlayer insulating film 61 and the gate insulating film 21 are then dry-etched with a fluorocarbon gas to form contact holes from which the high-density source-drain region is exposed. The resist pattern 6M is released thereafter.

This is followed by annealing for about 2 hours at 350° C. to 450° C. in a N$_2$ atmosphere, using an annealing furnace. Then, using the hydrogen contained in the silicon nitride film 61, the polycrystalline silicon film is hydrogenated. When the interlayer insulating film is formed of a silicon oxide film, hydrogenation is performed by performing annealing in an atmosphere of hydrogen, because the interlayer insulating film does not contain hydrogen.

Next, as shown in FIG. 1(N), a source-drain electrode (and line) film 71 is formed on the interlayer insulating film 61, in contact with the exposed source-drain region. For example, using a sputtering device, a Ti/Al/Ti film of 50 nm/200 nm/100 nm thick, respectively, is formed to form the source-drain electrode film 71.

Thereafter, as shown in FIG. 1(O), a resist pattern 7M with the shape of the source-drain electrodes (and lines) is formed. Using the resist pattern 7M as a mask, the source-drain electrode film 71 is patterned by dry etching using a chlorine gas. The resist pattern 7M is released thereafter. In the pixel TFT, one of the source-drain regions is in contact with the video data bus lines, and the other source-drain region is provided thereon with a contact pad for making contact with the transparent electrode. This is because the direct contact between silicon and indium-tin oxide (ITO) makes it difficult to maintain ohmic characteristics and ensure sufficient performance.

Next, as shown in FIG. 1(P), a second interlayer insulating film 81 is formed to form contact holes for the transparent electrodes. For example, a photosensitive transparent organic resin insulating film 81 is applied, and the contact holes are formed by exposure and development. This is followed by heat treatment to cure the organic resin insulating film 81.

Note that, it is generally not required to form transparent electrodes for the peripheral circuits. However, when terminals for testing circuit operation are provided, it is preferable to form an ITO film on the test terminals, in order to prevent malfunctions. In the pixel TFT, contact holes are formed from which the pad for the transparent electrode is exposed.

Next, as shown in FIG. 1(Q), a transparent electrode 91 is formed. For example, using a sputtering device, an ITO film (transparent electrode) 91 is deposited to a thickness of about 70 nm. Then, a photoresist pattern is formed on the ITO film (transparent electrode) 91. The transparent electrode 91 is then patterned by wet etching using an ITO etcher. The resist pattern is released thereafter.

Note that, in this example, the high-speed transistors HS:NTFT are not doped with the low-density impurity, and the impurity doping for the polycrystalline semiconductor film (silicon film) 13 is performed through the gate insulating film.

Note that, the high-density impurity doping takes time if it is to be performed through an insulating film of a certain thickness. By doping the impurity after the gate insulating film is removed, a lower acceleration energy and a shorter time period are required for the doping.

The following describes a modification example of the foregoing first example.

FIGS. 2(A), 2(B), 2(C), 2(D), 2(E), 2(F), 2(G), and 2(H) are cross sectional views representing a modification example of the first example. FIG. 2(A), like FIG. 1(F), shows a state in which a gate insulating film 21 formed of silicon oxide is formed on a polycrystalline semiconductor film (silicon film) 13.

First, as shown in FIG. 2(B), as in the step of FIG. 1(G), an opening is formed over the entire region of the interconnecting transistors CTFT, and n-type impurity is injected via a resist pattern 2M that provides an opening except for the channel region of the pixel transistors PIX:NTFT. The resist pattern 2M covers the channel region of the high-speed transistors HS:NTFT but provides an opening for the other regions. As such, the LDD region is formed also for the high-speed transistors HS:NTFT. The resist pattern 2M is removed, and, as shown in FIG. 2(C), the gate electrode film 31 is formed as in the deposition step represented by FIG. 1(H).

Thereafter, as shown in FIG. 2(D), a resist pattern 3M is formed as in the step of FIG. 1(I), and the gate electrode film 31 is etched. In the high-speed n-channel transistors HS:NTFT, the resist pattern 3 and the gate electrode 31a are formed to slightly overlap the LDD region. The LDD region remaining below the gate electrode 31a alleviates deterioration caused by hot carriers. This configuration may be applied to where it is suited, since a margin needs to be provided for overlap accuracy and since this requires an extra layout area.

Next, as shown in FIG. 2(E), a resist pattern 4M is formed as in the step of FIG. 1(J). It should be noted here that the resist pattern 4M is not just for impurity doping but it serves as a mask for etching the gate insulating film prior to impurity doping. Specifically, the gate insulating film formed of silicon oxide in the opening is etched, using the resist pattern 4M as an etching mask and a fluorocarbon gas as an etchant. As a result, the polycrystalline semiconductor film (silicon film) 13 is exposed. This is followed by injection of phosphorus P ions at an acceleration energy of 10 keV and a dose of 1.0E15. Because the gate insulating film has been removed, the acceleration energy can be reduced. This enables the ions to be injected at high density and thereby reduces the time required for the impurity doping. The resist pattern 4M is then removed by ashing.

Then, as shown in FIG. 2(F), a resist pattern 5M is formed that provides an opening for the p-channel transistor region, as in the step of FIG. 1(K). The resist pattern 5M also serves as an etching mask and a mask for impurity doping. The gate insulating film formed of silicon oxide is then etched with a fluorocarbon gas to expose the polycrystalline semiconductor film (silicon film) 13. Thereafter, boron B ions are injected at an acceleration energy of 10 keV and a dose of 1.0E15, so as to form a p-type source-drain region. By thus performing impurity doping after the gate insulating film is removed, the injection density can be increased and the doping time can be reduced.

FIGS. 2(G) and 2(H) represent the step of depositing an interlayer insulating film and the step of forming contact holes, as in the steps of FIGS. 1(L) and 1(M). Since the gate insulating film has been removed already, the step of forming contact holes is performed by forming an opening in the interlayer insulating film 61. The subsequent steps are the same as those described in the first example. As a result, the thin-film transistor substrate is formed.

In the foregoing first example, one kind of gate insulating film was used.

In order to withstand high voltage, the gate insulating film needs to have a thickness that is sufficient to withstand high voltage. Such a thickness, however, is unnecessary for the low-voltage and high-speed transistors as it prevents the high-speed operation. It is possible, then, to facilitate high-speed operation when gate insulating films having different thicknesses are used according to the required level of voltage resistance.

FIGS. 3(A), 3(B), 3(C), 3(D), 3(E), 3(F), 3(G), and 3(H) are cross sectional views representing a manufacturing method of a thin-film transistor substrate using gate insulating films having different thicknesses, according to a second example of the present invention. The following mainly describes what was not described in the first example.

As shown in FIG. 3(A), the steps of FIGS. 1(D) and 1(E) are followed. First, a base insulating film is formed on the glass substrate 10 by depositing a silicon nitride film 11 and a silicon oxide film 12. On the base insulating film, an amorphous silicon film 13 having a thickness of 40 nm is deposited, and the amorphous silicon film 13 is turned into polycrystals by irradiation of an excimer laser and is etched in island patterns. As a result, an island-like polycrystalline semiconductor film (silicon film) 13 is formed. This is the same as the first example.

In the second example, description is made based on a total of 5 kinds of transistors: 2 kinds of n-channel transistors LV (low voltage):NTFT and HV (high voltage):NTFT; 2 kinds of p-channel transistors LV (low voltage):PTFT and HV (high voltage):PTFT; and an interconnecting transistor CTFT. The interconnecting transistor CTFT may be of a low-voltage type or a high-voltage type. Here, description is made based on a high-voltage configuration.

On an island-like semiconductor film (silicon film) 13, a silicon oxide film having a thickness of 30 nm is deposited by plasma CVD, and a first gate insulating film 22 is formed that is suited for the low-voltage transistors. The gate insulating film is considerably thinner than the gate insulating film 21 of 110 nm thick shown in FIG. 1(F), and therefore improvement in the characteristics of the low-voltage transistors can be expected.

As shown in FIG. 3(B), a resist pattern 2M is formed that provides an opening for the LDD region of the high-voltage n-channel transistors HV:NTFT, and the channel region of the interconnecting transistors, as in the step of FIG. 1(G). Using the resist pattern 2M as a mask, n-type impurity phosphorus P ions are injected at an acceleration energy of 30 keV and a dose of 5E13. As a result, a LDD region having a GOLD structure, and a channel region of the normally-on transistor are formed through a thin gate insulating film. The thin gate insulating film allows for efficient impurity doping. The resist pattern 2M is removed thereafter.

Next, as shown in FIG. 3(C), a first gate electrode film 32 is formed on the first gate insulating film 22, as in the step of FIG. 1(H). For example, a Mo film of 300 nm thick is formed by sputtering.

Thereafter, as shown in FIG. 3(D), a resist pattern 3-1M having a gate electrode pattern for the low-voltage transistors is formed on the first gate electrode film 32, and the gate electrode 32a of the low-voltage transistor is patterned. For example, this is performed by wet etching using a phosphoric/ nitric etchant. The resist pattern 3-1M is released thereafter. The gate electrode 32a of the low-voltage transistors also serves as a mask for impurity doping in the subsequent step.

Next, as shown in FIG. 3(E), a resist pattern 4 for doping a high-density source-drain region of the n-channel transistors is formed as in the step of FIG. 1(J). Here, the high-voltage transistors HV:NTFT and the gate electrodes of the interconnecting transistors CTFT have not been formed. The resist pattern 4 provides an opening for the entire region of the low-voltage NTFT, the high-voltage transistors HV:NTFT, and the high-density source-drain region of the interconnecting transistors CTFT. Then, n-type impurity phosphorus P ions are injected at an acceleration energy of 30 keV and a dose of 1.5E15. In this example, the thin gate insulating film allows for efficient impurity doping. The resist pattern 4 is removed thereafter by ashing.

Then, as shown in FIG. 3(F), impurity doping is performed to form a source-drain region of the p-channel transistors, as in the step of FIG. 1(K). Here, the gate electrodes of the high-voltage PTFT have not been formed. As such, a resist pattern 5M is formed that serves as a mask to cover the n-channel transistors and that overlies above the channel region of the high-voltage PTFT. Then, p-type impurity boron B ions are injected at an acceleration energy of 30 keV and a dose of 1.5E15. In this example, the thin gate insulating film allows for efficient impurity doping. The resist pattern 5M is removed thereafter by ashing.

Next, as shown in FIG. 3(G), a silicon oxide film 23 of, for example, 80 nm thick is deposited on the first gate insulating film 22 by plasma CVD, so as to form a second gate insulating film. Therefore, the first gate insulating film 22 and the second gate insulating film 23 have a total thickness of 110 nm, equal to the thickness of the gate insulating film 21 of the first example. Then, a second gate electrode film 33 is formed on the second gate insulating film 23. For example, a Mo film 33 with a thickness of 300 nm is formed by sputtering.

Thereafter, as shown in FIG. 3(H), a resist pattern 3-2M for forming the gate electrodes of the high-voltage transistors is formed on the second gate electrode film 33, which is then wet-etched with a phosphoric/nitric etchant. In the high-voltage NTFT, the gate electrodes are patterned so as to form a GOLD structure. The resist pattern 3-2M is released thereafter. Thereafter, annealing is carried out for 2 hours at 500° C. in an atmosphere of $N_2$, so as to activate the doped impurity.

This is followed by the steps of, for example, forming the interlayer insulating film, contact holes, and electrodes (lines), as in the first example. In this example, one additional mask is required, which, however, makes it possible to form the high-speed transistors with a thin gate insulating film, and the high-voltage transistors with a thick gate insulating film.

In the second example, it is also possible to form the LDD region in the low-voltage transistors, as in the first example. The doping step for the p-channel transistors may be performed at other timings. FIGS. 4(A), 4(B), 4(C), 4(D), 4(E), 4(F), 4(G), and 4(H) represent a first modification example of the second example. FIGS. 4(A), 4(B), 4(C), 4(D), and 4(E) represent steps corresponding to FIGS. 3(A), 3(B), 3(C), 3(D), and 3(E), respectively. What is different from the second example is that, in the low-density doping step of FIG. 4(B), the LDD region is also formed for the low-voltage high-speed NTFT. In regard to forming the LDD region, this modification example does not differ from that represented by FIGS. 2(A), 2(B), 2(C), 2(D), and 2(E).

FIGS. 4(F) and 4(G) represent the step of forming a second insulating film 23, the step of forming a second gate electrode film, and the step of patterning a second gate electrode 33a, as also shown in FIGS. 3(G) and 3(H).

FIG. 4(H) shows the step of doping the source-drain region of the p-channel transistors, replacing FIG. 3(F). Here, the p-type impurity is doped after the gate electrode is formed. This enables the gate electrode to be used as a mask. However, doping efficiency is poor because the impurity is doped through the thick gate insulating film. This problem can be overcome in a similar fashion as in the modification example described with reference to FIGS. 2(A), 2(B), 2(C), 2(D), 2(E), 2(F), 2(G), and 2(H).

FIGS. 5(A), 5(B), and 5(C) represent a modification example overcoming the foregoing problem. FIG. 5(A) represents the step corresponding to FIG. 4(G). Using a resist pattern 3-2M as a mask, the second gate electrode film is etched and second gate electrode 33a is patterned. The resist pattern 3-2M is removed thereafter.

Then, as shown in FIG. 5(B), using the gate electrode as an etching mask, the second gate insulating film 23 and the first gate insulating film 22 are etched. The resist pattern 3-2M may be left, and any remaining portion may be removed after etching the gate insulating film.

Next, as shown in FIG. 5(C), a resist pattern 5M is formed that exposes the p-channel transistors, and the p-type impurity is doped in the polycrystalline semiconductor film that has been exposed as a result of removing the gate insulating film. Doping efficiency is improved because the doping is performed after etching the gate insulating film, as in the modification example of FIGS. 2(A), 2(B), 2(C), 2(D), 2(E), 2(F), 2(G), and 2(H).

As described above, in the second example and the modification example thereof, low-density (LDD) doping for the n-channel transistors is performed, and then the gate electrode of the low-voltage transistors is formed on the thin gate insulating film, and this is followed by formation of the high-voltage transistors on the gate insulating film after the thickness of the gate insulating film is increased. These steps may be modified in many ways.

FIGS. 6(A), 6(B), 6(C), 6(D), 6(E), 6(F), 6(G), and 6(H) are cross sectional views representing a manufacturing method of a thin-film transistor substrate according to a third example of the present invention. FIG. 6(A) represents a step corresponding to FIG. 3(A). First, a silicon nitride film 11 and a silicon oxide film 12 are deposited on the glass substrate 10 to form a base insulating film. On the base insulating film, an amorphous silicon film having a thickness of 40 nm is deposited, and the amorphous silicon film is turned into polycrystals by irradiation of an excimer laser and is etched in island patterns. As a result, an island-like polycrystalline semiconductor film, (silicon film) 13 is formed. Then, a silicon oxide film having a thickness of, for example, 30 nm is deposited by plasma CVD to form a first gate insulating film 22. On the first gate insulating film 22, a Mo film is formed by sputtering to the thickness of 300 nm, so as to form a first gate electrode film 32.

Next, as shown in FIG. 6(B), a resist pattern 3-1M having a gate electrode pattern is formed on the transistor region other than the interconnecting transistors CTFT. The first gate electrode 32a is patterned by wet etching using a phosphoric/nitric etchant. In the high-voltage transistor region, a dummy gate electrode 32Da is formed. The resist pattern 3-1M is removed thereafter.

Then, as shown in FIG. 6(C), using the gate electrodes 32a and 32Da as a mask, n-type impurity phosphorus P ions are injected at an acceleration energy of 30 keV and a dose of 5E13, so as to form a low-density n-type LDD region and a normally-on channel. Here, the low-density n-type impurity is also injected in the p-channel transistor. Any problem arising from this can be prevented by compensating the low-density n-type impurity with subsequently injected high-density p-type impurity. The mask for LDD doping (resist pattern) 2M is not used.

Thereafter, as shown in FIG. 6(D), a resist pattern 4M for providing an opening for the high-density source-drain region of the n-channel transistor is formed, and the n-type impurity phosphorus P ions are injected at an acceleration energy of 30 keV and a dose of 1.5E15. In the low-voltage transistors LV:NTFT, the gate electrode is used as a mask. This step is analogous to that of FIG. 3(E).

Next, as shown in FIG. 6(E), a resist pattern 5M for providing an opening for the p-channel transistors is formed, and doping is performed to form the source-drain region of the p-channel transistors. For example, p-type impurity boron B ions are injected at an acceleration energy of 30 keV and a dose of 1.5E15. Here, a dummy gate 32D can be used as a mask because it is provided also for the high-voltage transistors HV:PTFT.

Then, as shown in FIG. 6(F), a resist pattern 8M is formed that covers the low-voltage transistor, and the dummy electrode 32Da exposed in the opening is removed. For example, this is performed by wet etching using a phosphoric/nitric etchant. The resist pattern 8M is released thereafter.

FIGS. 6(G) and 6(H) represent the step of forming the second gate insulating film 23 and the second gate electrode film 33, and the step of patterning the second gate electrode film 33, as also shown in FIGS. 3(G) and 3(H). For example, a silicon oxide film is deposited to the thickness of 80 nm by plasma CVD, so as to form the second gate insulating film 23. On the second gate insulating film 23, a Mo film having a thickness of 300 nm is formed by sputtering to form the second gate electrode film 33. Thereafter, a resist pattern 3-2M having a second gate electrode pattern is formed, and the gate electrode 33a is patterned by etching using a phosphoric/nitric etchant. The resist pattern 3-2M is released thereafter. Subsequently, the steps of the foregoing example after the formation of the interlayer insulating film are similarly carried out.

The thin-film transistor substrate may be formed in the manner described above. Here, circuit elements such as the short ring and the peripheral circuits are connected using the normally-on TFTs. This enables the peripheral circuits to be tested by turning off the normally-on TFTs. Then, a panel is formed by cutting the short ring. The panel may be formed without cutting the short ring. In this case, a reverse bias is applied to the interconnecting transistors CTFT during operation, in order to turn off the transistors.

By using the normally-on TFT for the interconnection of the short ring and the peripheral circuits, the short ring can be completely cut off from the peripheral circuits by turning off the normally-on TFT during testing. Note that, it is not easy to change characteristics of the p-Si TFT using stress voltage. In order to reliably form the normally-on TFT, the channel could be doped with impurities.

According to the foregoing example, TFTs of an active-matrix substrate shown in FIG. 7 are formed. Constituting elements other than the TFT may be formed by known processes. Note that, instead of the liquid crystal display device, an EL display device may be formed.

FIG. 8(A) shows an exemplary structure of a liquid crystal display device. An active-matrix substrate 201 includes a display area DA and a peripheral circuit (PH) area. The display area DA includes scan gate lines GL, auxiliary capacitor lines (bus lines) SCL, data lines DL, and a pixel structure. In the peripheral circuit (PH) region, a gate control circuit (gate driver) GD and a data control circuit (data driver) DD are formed. A counter substrate 202 includes a color filer 203 corresponding to a pixel region, and a common electrode 204 that is common to all pixels. A liquid crystal layer 205 is interposed between the color filter substrate (counter substrate) 202 and the active-matrix substrate 201.

FIG. 8(B) shows an exemplary structure of an organic EL panel. An active-matrix substrate 201 includes scan gate lines, data lines, and TFTs that are formed on a glass substrate along with other circuit elements, as in the foregoing example. In each pixel region, a source of TFT is connected to an anode 211 formed of, for example, ITO. On the anode 211, an organic EL element structure is formed in which a hole transport layer 212, a light-emitting layer 213, an electron transport layer 214, and a cathode 215 formed of aluminum or the like are laminated. The light emitted by the organic EL element propagates downward and emerges from the glass substrate of the active-matrix substrate 201. Above the organic EL element is covered with a sealant 220.

The foregoing described the present invention by way of examples. However, the present invention is not limited by the foregoing description. For examples, the materials and thicknesses used in the foregoing examples are merely examples, and as such may be varied appropriately according to design requirements. For example, instead of the glass substrate, a transparent insulating substrate such as a quartz substrate may be used. Further, the gate electrode layer may be a metal layer satisfying conditions of conductivity and heat resistance. Further, other than boron (B) and phosphorus (P), antimony (Sb) and arsenic (As) or the like may be used as the p-type and n-type impurities. Further, the gate insulating film may be an insulating film other than the silicon oxide film. Alternatively, a silicon-oxynitride film, a silicon nitride film, an organic insulating film or the like may be used as well. As to common techniques relating to the TFT substrate, reference may be made to, for example, Japanese Laid-Open Patent Publication No. 2004-228480 (published on Aug. 12, 2004), and United States Patent Application Publication Pub. No.: US2004/0191972A1. Various changes, modifications, and combinations are possible as would be evident to a person ordinary skill in the art.

INDUSTRIAL APPLICABILITY

The present invention can be suitably used for display devices such as the liquid crystal display device.

The invention claimed is:

1. A thin-film transistor substrate comprising:
an insulating transparent substrate;
a plurality of island-like semiconductor films formed above the insulating transparent substrate;
an insulating gate electrode structure including gate insulating films respectively formed on the island-like semiconductor films, and a gate electrode formed on each of the gate insulating films;
a pair of source-drain regions of a first conductive type formed in regions on both sides of the insulating gate electrode structure in a first island-like semiconductor film and a second island-like semiconductor film included in the plurality of island-like semiconductor films;
a LDD region of the first conductive type, formed on inner sides of the pair of source-drain regions of the first island-like semiconductor film, partially covered with the gate electrode by leaving a channel region below the gate electrode, and having a lower impurity density than the pair of source-drain regions; and
a normally-on channel region of the first conductive type, formed in the second island-like semiconductor film by being connected to the pair of source-drain regions, and having an impurity density substantially equal to the impurity density of the LDD region.

2. The thin-film transistor substrate as set forth in claim 1, further comprising:
   a pair of source-drain regions of a second conductive type opposite the first conductive type, formed in regions on both sides of the insulating gate electrode structure, in a third island-like semiconductor film included in the plurality of island-like semiconductor films; and
   a pair of source-drain regions of the first conductive type, formed in regions on both sides of and in contact with the insulating gate electrode structure, in a fourth island-like semiconductor film included in the plurality of island-like semiconductor films.

3. The thin-film transistor substrate as set forth in claim 2, comprising:
   a display area;
   a peripheral circuit for the display area;
   a short ring formed outside of the display area and the peripheral circuit; and
   a switching element for selectively connecting the peripheral circuit with the short ring,
   wherein the display area includes the first island-like semiconductor film,
   wherein the peripheral circuit includes the third island-like semiconductor film and the fourth island-like semiconductor film, and
   wherein the switching element includes the second island-like semiconductor film.

4. The thin-film transistor substrate as set forth in claim 2, further comprising:
   a LDD region of the first conductive type, formed on inner sides of the pair of source-drain regions in the fourth island-like semiconductor film by being covered with the gate electrode, and having a lower impurity density than the pair of source-drain regions.

5. The thin-film transistor substrate as set forth in claim 2, wherein the gate insulating film formed on the first island-like semiconductor film includes a laminate formed by a first gate insulating film and a second gate insulating film, and
   wherein the gate insulating film formed on the fourth island-like semiconductor film is formed of only the first gate insulating film.

6. The thin-film transistor substrate as set forth in claim 4, wherein the gate insulating film formed on the first island-like semiconductor film includes a laminate formed by a first gate insulating film and a second gate insulating film, and
   wherein the gate insulating film formed on the fourth island-like semiconductor film is formed of only the first gate insulating film.

7. A liquid crystal display device which includes a thin-film transistor substrate of claim 1.

8. A method for manufacturing a thin-film transistor substrate, comprising the acts of:
   (a) forming a plurality of island-like semiconductor films above an insulating transparent substrate;
   (b) forming gate insulating films on the island-like semiconductor films, respectively;
   (c) forming a LDD region of a first conductive type on both sides of a channel region remaining in a first island-like semiconductor film included in the plurality of island-like semiconductor films, and forming a normally-on channel region of the first conductive type, having an impurity density substantially equal to an impurity density of the LDD region, in a second island-like semiconductor film included in the plurality of island-like semiconductor films;
   (d) forming a first gate electrode on the gate insulating film, so as to partially cover the LDD region of the first island-like semiconductor film, and forming a second gate electrode above the normally-on channel region formed in areas other than both sides of the second island-like semiconductor film; and
   (e) forming a pair of source-drain regions of a first conductive type, having a higher impurity density than the LDD region, in regions on both sides of the gate electrode of the first island-like semiconductor film and the second island-like semiconductor film.

9. The method for manufacturing a thin-film transistor substrate as set forth in claim 8,
   wherein, in said act (d), third and fourth gate electrodes are respectively formed above third and fourth island-like semiconductor films included in the plurality of island-like semiconductor films,
   wherein, in act (e), the pair of source-drain regions of the first conductive type having a high impurity density is also formed on both sides of the fourth gate electrode of the fourth island-like semiconductor films,
   said method further comprising the act (f) of forming a pair of source-drain regions of a second conductive type opposite the first conductive type in regions on both sides of the insulating gate electrode of the third island-like semiconductor film.

10. The method for manufacturing a thin-film transistor substrate as set forth in claim 9, further comprising the acts of:
   (g) forming a display region on the insulating transparent substrate, using the first island-like semiconductor film;
   (h) forming a peripheral circuit, using the third and fourth island-like semiconductor films;
   (i) forming a short ring outside of the display area and the peripheral circuit;
   (j) forming a switching element that selectively connects the short ring with the peripheral circuit, using the second island-like semiconductor film; and
   (k) turning off the switching element to test the peripheral circuit.

11. The method for manufacturing a thin-film transistor substrate according to claim 10,
   wherein said act (b) includes the acts of:
   (b-1) forming a first gate insulating film after said act (a); and
   (b-2) forming a second gate insulating film above the first gate insulating film, and
   wherein said act (d) includes the acts of:
   (d-1) forming a first gate electrode on the first gate insulating film; and
   (d-2) forming a second gate electrode on the second gate insulating film.

12. The method for manufacturing a thin-film transistor substrate according to claim 11,
   wherein, in said act (d-1), the first gate electrode is formed on each of the plurality of island-like semiconductor films except for the second island-like semiconductor film, and
   wherein, in said act (d-2), the second gate electrode is formed after the first gate electrode is partially removed.

* * * * *